(12) United States Patent
Park et al.

(10) Patent No.: US 8,492,770 B2
(45) Date of Patent: Jul. 23, 2013

(54) THIN FILM TRANSISTOR AND METHOD OF MANUFACTURING THE SAME

(75) Inventors: Jae-Woo Park, Seongnam-si (KR); Je-Hun Lee, Seoul (KR); Seong-Jin Lee, Seoul (KR); Yeon-Hong Kim, Yongin-si (KR)

(73) Assignee: Samsung Display Co., Ltd. (KR)

( * ) Notice: Subject to any disclaimer, the term of this patent is extended or adjusted under 35 U.S.C. 154(b) by 128 days.

(21) Appl. No.: 13/035,054

(22) Filed: Feb. 25, 2011

(65) Prior Publication Data

US 2011/0215322 A1 Sep. 8, 2011

(30) Foreign Application Priority Data

Mar. 2, 2010 (KR) .................. 10-2010-0018421

(51) Int. Cl.
*H01L 29/786* (2006.01)
(52) U.S. Cl.
USPC 257/60; 257/49; 257/E29.003; 257/E29.273; 257/E29.299; 257/E21.412; 438/482; 438/483
(58) Field of Classification Search
USPC ............... 257/49, 51, 60, E29.003, E29.273, 257/E29.299, E21.412; 438/156, 482, 483
See application file for complete search history.

(56) References Cited

U.S. PATENT DOCUMENTS

| | | | |
|---|---|---|---|
| 5,365,079 A * | 11/1994 | Kodaira et al. | 257/59 |
| 6,713,785 B2 * | 3/2004 | Yagi | 257/59 |
| 6,808,965 B1 * | 10/2004 | Miyasaka et al. | 438/151 |
| 2003/0111663 A1 * | 6/2003 | Yagi | 257/59 |
| 2007/0194450 A1 * | 8/2007 | Tyberg et al. | 257/751 |
| 2008/0296569 A1 | 12/2008 | Ho et al. | |
| 2011/0006297 A1 * | 1/2011 | Inoue et al. | 257/43 |
| 2012/0080753 A1 * | 4/2012 | Singh et al. | 257/347 |
| 2012/0305929 A1 * | 12/2012 | Tyberg et al. | 257/66 |

FOREIGN PATENT DOCUMENTS

| | | |
|---|---|---|
| JP | 10-092747 A | 4/1998 |
| KR | 1020080032590 A | 4/2008 |

OTHER PUBLICATIONS

Kobayashi et al., "Optical and electrical properties of amorphous and microcrystalline GaN films and their application to transparent TFT," 1997 (no month given), Applied Surface Science, vol. 113/114, pp. 480-484.*

* cited by examiner

*Primary Examiner* — Allan R Wilson
(74) *Attorney, Agent, or Firm* — Innovation Counsel LLP

(57) ABSTRACT

A thin film transistor includes a gate electrode formed on a substrate, a semiconductor pattern overlapped with the gate electrode, a source electrode overlapped with a first end of the semiconductor pattern and a drain electrode overlapped with a second end of the semiconductor pattern and spaced apart from the source electrode. The semiconductor pattern includes an amorphous multi-elements compound including a II B element and a VI A element or including a III A element and a V A element and having an electron mobility no less than 1.0 cm$^2$/Vs and an amorphous phase, wherein the VI A element excludes oxygen. Thus, a driving characteristic of the thin film transistor may be improved.

16 Claims, 20 Drawing Sheets

THIN FILM TRANSISTOR AND METHOD OF MANUFACTURING THE SAME

This application claims priority to Korean Patent Applications No. 2010-0018421, filed on Mar. 2, 2010, and all the benefits accruing therefrom under 35 U.S.C. §119, the contents of which are herein incorporated by reference in their entirety.

BACKGROUND OF THE INVENTION

1. Field of the Invention

A thin film transistor and a method of manufacturing the thin film transistor are provided. More particularly, example embodiments relate to a thin film transistor having improved driving characteristics, and to a method of manufacturing the thin film transistor.

2. Description of the Related Art

In general, a display panel includes a display substrate including a switching element driving a pixel, and an opposing substrate facing the display substrate. The switching element may be a thin film transistor. The thin film transistor includes a gate electrode, a source electrode, a drain electrode and a semiconductor pattern forming a channel electrically connecting the source electrode to the drain electrode. The semiconductor pattern usually is formed from amorphous silicon (a-Si), poly-silicon (poly-Si), or oxide semiconductor.

An amorphous silicon layer may be easily formed on a large-sized substrate. However, because electron mobility of the amorphous silicon layer is about 0.5 $cm^2/Vs$, the amorphous silicon layer has low driving characteristics. A polysilicon layer, on the other hand, has an electron mobility in the range of 10 to hundreds of $cm^2/Vs$, which is greater than that of the amorphous silicon layer. However, to form the polysilicon layer a process of crystallizing an amorphous silicon layer must be performed. Thus, it is difficult to form the polysilicon layer uniformly on a large-sized substrate, and manufacturing costs for forming the polysilicon layer are high.

As the size of display devices increase, the length required for signal lines increases, and electrical resistance also increases. The increase in electrical resistance causes RC signal delay. To solve the above problem, the signal line may be formed from a material having a low electrical resistance. However, available materials that have the appropriate physical and electrical characteristics are limited. In order to prevent RC signal delay, the time required to charge a pixel with a voltage must be reduced. Thus, the electron mobility of the semiconductor pattern of the thin film transistor driving the pixel needs to be high. However, it is difficult to form a polysilicon layer uniformly on a large-sized substrate, and an oxide semiconductor has a relatively low reliability.

SUMMARY OF THE INVENTION

A thin film transistor having improved electron mobility and capable of being applied to a large-sized display device is provided.

A method of manufacturing the thin film transistor is also provided.

A thin film transistor includes a gate electrode formed on a substrate, a semiconductor pattern overlapped with the gate electrode, a source electrode overlapped with a first end of the semiconductor pattern and a drain electrode overlapped with a second end of the semiconductor pattern and spaced apart from the source electrode. The semiconductor pattern includes an amorphous multi-elements compound including a II B element and a VI A element or including a III A element and a V A element, wherein the VI A element excludes oxygen. The semiconductor pattern has an electron mobility no less than 1.0 $cm^2/Vs$. The multi-elements compound has an amorphous phase.

The multi-elements compound may include GaAs, GaSb, GaBi, GaP, InP, InAs, InSb, InBi, CdS, CdSe, CdTe, ZnS, ZnSe, ZnTe, HgS, HgSe, HgTe, AlP, AlAs, AlSb and AlBi.

The multi-elements compound may further include at least one selected from the group consisting of a II A element, a III B element, a IV B element, a V B element, a VI B element, a VII B element, a I B element, a IV A element and VIII B element.

The multi-elements compound may further include carbon, oxygen or hydrogen atoms and the content of each of the carbon, oxygen and hydrogen atoms is about $1 \times 10^{13}$ atom/$cm^3$ to about $1 \times 10^{19}$ atom/$cm^3$ of the multi-elements compound.

In another aspect, a thin film transistor includes a semiconductor pattern including a multi-elements compound including a II B element and a VI A element or including a III A element and a V A element, wherein the VI A element excludes oxygen. The multi-elements compound has a mixed phase including an amorphous phase and a crystalline phase.

The crystalline phase may include a plurality of grains having a grain size of about 0.1 nm to about 1 μm.

An electron mobility of the semiconductor pattern may be 1.0 $cm^2/Vs$ to 3,500 $cm^2/Vs$.

In another aspect, a thin film transistor includes a semiconductor pattern including a multi-elements compound including a II B element and a VI A element or including a III A element and a V A element, wherein the VI A element excludes oxygen. The multi-elements compound has a crystalline phase including a plurality of grains having a grain size of about 0.1 nm to about 1 μm.

A method of manufacturing a thin film transistor is provided. In the method, a gate electrode is formed on a substrate. A source of a multi-elements compound including a II B element and a VI A element or including a III A element and a V A element is deposited on the substrate to form a semiconductor layer. The semiconductor layer includes the multi-elements compound. The semiconductor layer is patterned to form a semiconductor pattern overlapped with the gate electrode. A source electrode overlapped with a first end of the semiconductor pattern is formed, and a drain electrode overlapped with a second end of the semiconductor pattern and spaced apart from the source electrode is formed.

The semiconductor layer may be formed through a pulse laser deposition (PLD) method, a thermal evaporation method, molecular beam epitaxy (MBE) method, a vapor deposition (CVD) method, a metal-organic chemical vapor deposition (MOCVD) method or an atomic layer deposition (ALD) method. Alternatively, the semiconductor layer may be formed through a plasma enhanced chemical vapor deposition (PECVD) method or a plasma enhanced metal-organic chemical vapor deposition (PEMOCVD) method.

The semiconductor layer may have an amorphous phase. Alternatively, the semiconductor layer may have a mixed phase including an amorphous phase and a crystalline phase. Alternatively, the semiconductor layer may have a crystalline phase including a plurality of grains having a grain size of about 0.1 nm to about 1 μm.

A thin film transistor that is driven with a high speed may be formed, and a manufacturing cost of a thin film transistor may be reduced. Thus, the thin film transistor may be applied to an array substrate for a display device thereby achieving a high frequency driving characteristic required for a large-sized display device having a high resolution.

BRIEF DESCRIPTION OF THE DRAWINGS

The above and other features and advantages will become more apparent by describing in detail exemplary embodiments thereof with reference to the accompanying drawings, in which:

FIG. 24A is a graph showing XPS analysis of a thin layer including In—Ga—As;

DETAILED DESCRIPTION OF THE INVENTION

The exemplary embodiments are described more fully hereinafter with reference to the accompanying drawings.

Exemplary Embodiment 1

Figure 1:
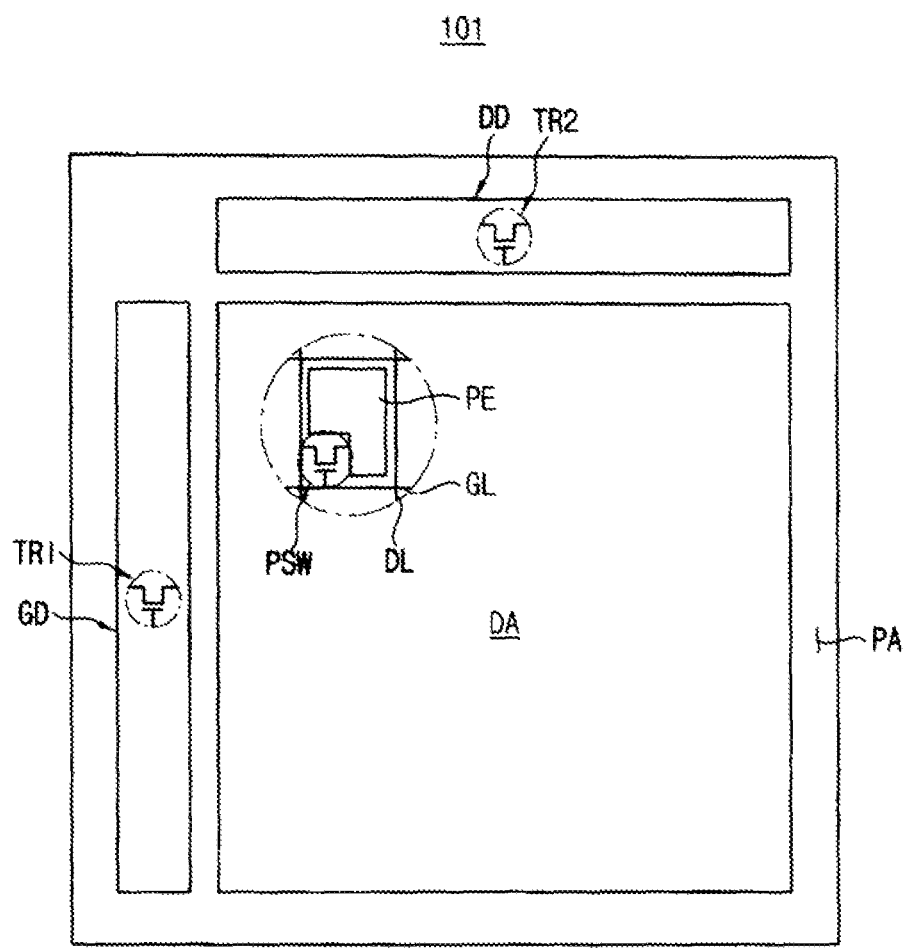
FIG. 1 is a plan view illustrating a display substrate according to an example embodiment.

FIG. 1 is a plan view illustrating a display substrate according to an example embodiment.

Referring to FIG. 1, a display substrate 101 includes a pixel part formed in a display area DA, and a gate driver GD and a data driver DD, which are formed in a peripheral area PA surrounding the display area DA.

The pixel part includes a pixel transistor PSW and a pixel electrode PE electrically connected to the pixel transistor PSW. The pixel part may be surrounded by a gate line GL and a data line DL, which are formed in the display area DA. The gate driver GD transfers a gate driving signal to the pixel part, and includes a plurality of first circuit transistors TR1. The data driver DD transfers a data driving signal to the pixel part, and includes a plurality of second circuit transistors TR2. The pixel transistor PSW is a thin film transistor, and each of the first and second circuit transistors TR1 and TR2 are thin film transistors.

The pixel transistor PSW and the first and second circuit transistors TR1 and TR2 are described more fully hereinafter with reference to FIGS. 2 and 3. The second circuit transistor TR2 is substantially the same as the first circuit transistor TR1, except for signal lines connected thereto. Thus, duplicative explanation for the second circuit transistor TR 2 will be omitted.

Figure 2:
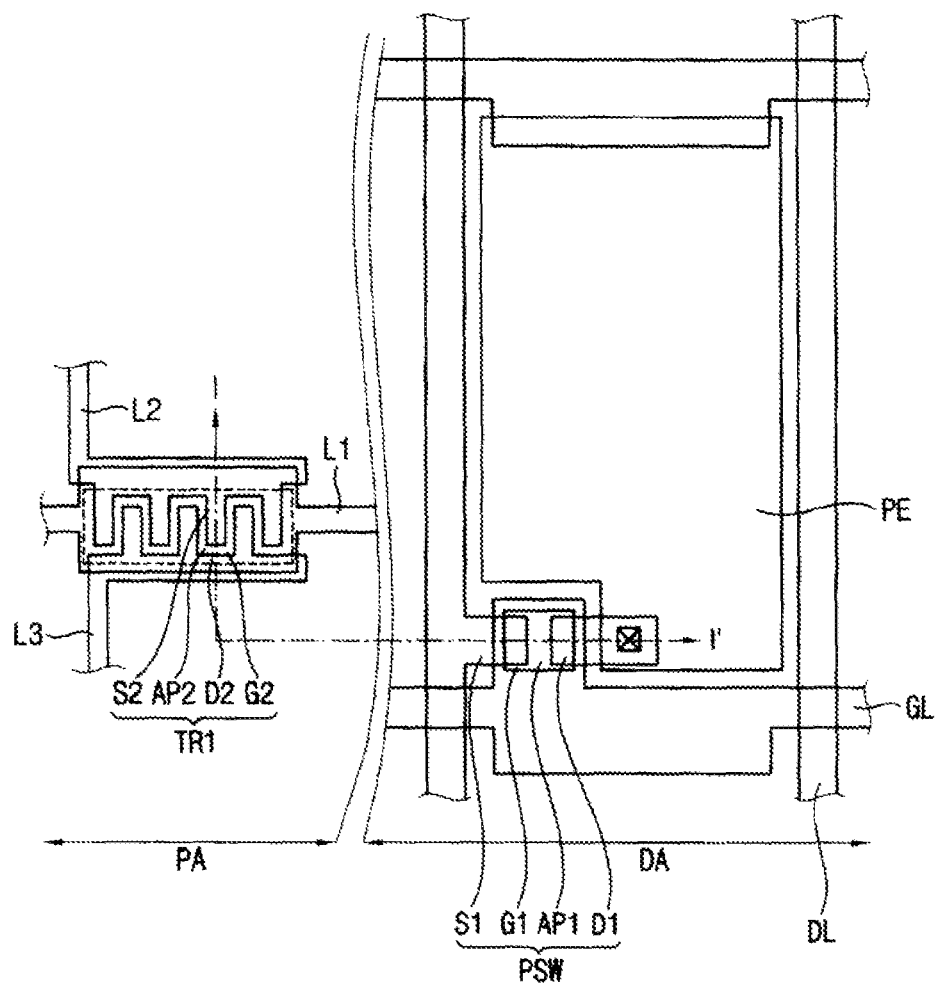
FIG. 2 is an enlarged plan view illustrating the circuit transistors and the pixel transistor illustrated in FIG. 1.
Figure 3:
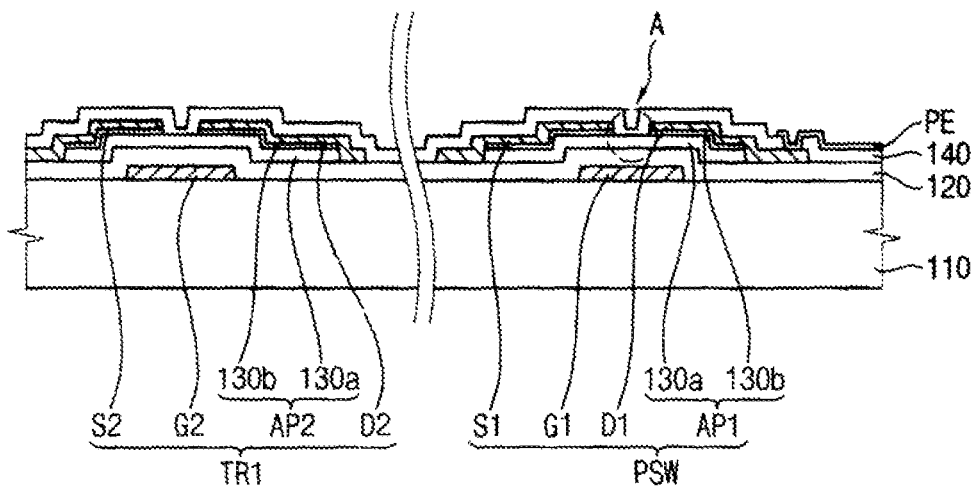
FIG. 3 is a cross-sectional view taken along a line I-I' of FIG. 2.

FIG. 2 is an enlarged plan view illustrating the circuit transistors and the pixel transistor illustrated in FIG. 1, and FIG. 3 is a cross-sectional view taken along a line I-I' of FIG. 2.

Referring to FIGS. 2 and 3, the pixel transistor PSW includes a first gate electrode G1 connected to the gate line GL, a first source electrode 51 connected to the data line DL, a first drain electrode D1 spaced apart from the first source electrode 51, and a first semiconductor pattern AP1.

The first semiconductor pattern AP1 is formed on the first gate electrode G1, and is overlapped with the first gate electrode G1. The first semiconductor pattern AP1 includes a first semiconductor layer 130a containing an amorphous multi-elements compound. The amorphous multi-elements compound includes at least two chemically different elements chemically combined with each other, and has an amorphous phase. Examples of the multi-elements compound may include a double-elements (i.e. binary) compound that includes two chemically different elements, a triple-elements (i.e. ternary) compound that includes three chemically different elements, and a quadruple-elements (i.e. quaternary) compound that includes four chemically different elements, etc.

For example, the multi-elements compound may include a double-elements compound that includes a II B element and a VI A element of the periodic table, or that includes a III A element and a V A element (as used herein, the term "II B element" refers to an element found in column II B of the periodic table under the naming system of the Chemical Abstract Service of the American Chemical Society ("CAS"), which are group 12 elements under the modern naming system of the International Union of Pure and Applied Chemistry ("IUPAC"), and are, specifically, the elements Zn, Cd, and Hg; as used herein, the term "VI A element" refers to an element found in column VI A of the periodic table under the CAS naming system, which are group 16 elements under the modern IUPAC naming system, and are, specifically, the elements O, S, Se, Te and Po; as used herein, the term "III A element" refers to an element found in column IIIA of the periodic table under the CAS naming system, which are group 13 elements under the modern IUPAC naming system, and are, specifically, the elements B, Al, Ga, In, and Tl; as used herein, the term "V A element" refers to an element found in column V A of the periodic table under the CAS naming system, which are group 15 elements under the modern IUPAC naming system, and are, specifically, the elements N, P, As, Sb and Bi). If the double-elements compound includes oxygen, the double-elements compound may be reduced by hydrogen from an insulating layer, which can cause deterioration in the quality of the first semiconductor pattern AP 1. Thus, oxygen is excluded from exemplary embodiments that include VI A elements. Examples of the double-elements compounds may include GaAs, GaSb, GaBi, GaP, InP, InAs, InSb, InBi, CdS, CdSe, CdTe, ZnS, ZnSe, ZnTe, HgS, HgSe, HgTe, AlP, AlAs, AlSb, AlBi, and etc.

The following Table 1 presents electron mobility of a single crystalline phase, effective mass, ionization degree, and electron mobility of an amorphous phase of GaAs, GaSb, InP, InAs, InSb, CdS, CdSe, CdTe, ZnS, ZnSe and ZnTe as examples of double-elements compounds.

TABLE 1

| element | electron mobility of a single crystal ($cm^2/Vs$) | ionization degree | electron mobility of an amorphous phase ($cm^2/Vs$) |
|---|---|---|---|
| Si | 1,350 | 0 | 0.5-1 |
| Ge | 3,900 | 0 | 1-2 |
| GaAs | 8,500 | 32 | 27-270 |
| GaSb | 5,000 | 26 | 13-130 |
| InP | 4,000 | 44 | 17-170 |
| InAs | 22,600 | 35 | 79-790 |
| InSb | 100,000 | 32 | 320-3,200 |
| CdS | 350 | 69 | 1.7-17 |
| CdSe | 650 | 70 | 4.5-45 |
| CdTe | 1,050 | 67 | 7.6-76 |
| ZnS | 140 | 62 | 0.87-8.7 |
| ZnSe | 530 | 63 | 3.3-33 |
| ZnTe | 340 | 61 | 2.1-21 |

Referring to Table 1, the double-elements compound may have an electron mobility that is greater than 1 $cm^2/Vs$ even if the double-elements compound has an amorphous phase. In particular, the double-elements compounds in the amorphous phase have electron motilities in the range of 1 $cm^2/Vs$ to 3,500 $cm^2/Vs$, and the electron mobility can be increased through use of a dopant. Furthermore, when the double-elements compound has a mixture of phases that includes an amorphous phase and a crystalline phase, the electron mobility may be further increased. As the electron mobility is increased, the speed of an electron moving from the first source electrode S1 to the first drain electrode D1 through the first semiconductor pattern AP1 is increased. Thus, when a double-elements compound is used in the pixel transistor PSW, an RC delay of the pixel transistor PSW may be reduced.

The double-elements compound has a relatively high degree of electron mobility as compared to a silicon compound or a germanium compound. A covalently bonded compound in which elements are combined with each other via a covalent bond has an ionization degree of 0, and the arrangement of the covalently bonded compound in an amorphous phase is irregular, so that chemical attractive forces (non-covalent bonds) between adjacent elements are relatively weak. Particularly, in the covalently bonded compound, orbitals of each element have a tetrahedron shape, and non-covalent bonds between elements in an amorphous phase are easily broken, even in the case where location of the elements is the amorphous phase is only slightly changed as compared to a crystalline phase. Therefore, the moving path of an electron is irregular, and an electron hardly moves in the covalently bonded compound. Thus, covalently bond compounds having in an amorphous phase have a low electron mobility. In contrast, the double-elements compounds, which have a relatively large electron mobility, an orbital of each element has a spherical shape. Thus, even if location of the elements is changed as compared to a crystalline phase, because orbitals of adjacent elements are overlapped with each other, the decrease in electron mobility is less as compared to the covalently bonded compound.

The triple-elements compound includes two elements of the double-elements compound and an additional element. The additional element is different from the elements of the two elements in the double-elements, and may be, for example, a III A element or a V A element. Examples of the triple-elements compound may include InGaP, InGaAs, InGaSb, InAlP, InAlAs, InAlSb, AlGaP, AlGaAs, AlGaSb, GaAsP, GaAsSb, GaAsBi, GaSbP, GaSbBi, GaSbP, GaBiP, AlAsP, AlAsSb, AlAsBi, AlSbP, AlSbBi, AlSbP, AlBiP, InAsP, InAsSb, InAsBi, InSbP, InSbBi, InSbP, InBiP and etc.

The quadruple-elements compound includes three elements of the triple-elements compound and an additional element. The additional element is different from the elements of the triple-elements, and may be, for example, a III A element or V A element. Examples of the quadruple-elements compound may include InGaAsP, AlGaAsP, AlInAsP, etc.

Alternatively, the multi-elements compound may include at least five elements that are different from each other.

Furthermore, the double-elements compound or the triple-elements compound may include a dopant that is different from the elements included therein. Examples of the dopant may include II A element, III B element, IV B element, V B element, VI B element, VII B element, I B element, IV A element, VIII B element, etc (as used herein, the term "II A element" refers to the an element found in column II A of the periodic table under the CAS naming system, which are group 2 elements under the modern IUPAC naming system, and are, specifically, the elements Be, Mg, Ca, Sr, Ba, and Ra; as used herein, the term "III B element" refers to an element found in column III B of the periodic table under the CAS naming system, which are group 3 elements under the modern IUPAC naming system, and are, specifically, the elements Sc, Y, La and Ac; as used herein, the term "IV B element" refers to an element found in column IV B of the periodic table under the CAS naming system, which are group 4 elements under the modern IUPAC naming system, and are, specifically, the elements Ti, Zr, Hf and Rf; as used herein, the term "V B element" refers to an element found in column V B of the periodic table under the CAS naming system, which are group 5 elements under the modern IUPAC naming system, and are, specifically, the elements V, Nb, Ta and Db; as used herein, the term "VI B element" refers to an element found in column VI B of the periodic table under the CAS naming system, which are group 6 elements under the modern IUPAC naming system, and are, specifically, the elements Cr, Mo, W and Sb; as used herein, the term "VII B element" refers to an element found in column VII B of the periodic table under the CAS naming system, which are group 7 elements under the modern IUPAC naming system, and are, specifically, the elements Mn, Te, Re and Bh; as used herein, the term "IB element" refers to an element found in column I B of the periodic table under the CAS naming system, which are group 11 elements under the modern IUPAC naming system, and are, specifically, the elements Cu, Ag and Au; as used herein, the term "IV A element" refers to an element found in column IV A of the periodic table under the CAS naming system, which are group 14 elements under the modern IUPAC naming system, and are, specifically, the elements C, Si, Ge, Sn and Pb; as used herein, the term "VIII B element" refers to an element found in column VIII B of the periodic table under the CAS naming system, which are group 17 elements under the modern IUPAC naming system, and are, specifically, the elements Fe, Ru, Os, Hs, Co, Rh, Ir, Mt, Ni, Pd, Pt and Ds). In particular, examples of the dopant may include Be, Mg, Ca, Sr, Ba, Ra, Sc, Y, Ti, Zr, Hf, V, Nb, Ta, Cr, Mo, W, Mn, Tc, Re, C, Si, Ge, Sn, Pb, Cu, Ag, Au, Fe, Ru, Os, Co, Rh, Ir, Ni, Pd, Pt, etc.

Referring to FIGS. 2 and 3, the first source electrode 51 is formed on the first semiconductor pattern AP1, and is overlapped with a first edge of the first semiconductor pattern AP1. The first drain electrode D1 is formed on the first semiconductor pattern AP1, and is overlapped with a second edge of the first semiconductor pattern AP1. When, the first source and first drain electrode S1 and D1 directly make a contact with the first semiconductor pattern AP1, electrical resistance may be increased. Thus, the first semiconductor pattern AP1 may include a first semiconductor layer 130a and a first ohmic contact layer 130b formed between the first semiconductor layer 130a and the first source electrode S1, and also between first semiconductor layer 130a and the first drain electrode D1.

The first ohmic contact layer 130b may be formed by implanting an impurity into a surface of the first semiconductor layer 130a at a high concentration. Examples of such an impurity may include II A element, III B element, IV B element, V B element, VI B element, VII B element, I B element, IV A element, VIII B element, etc. Alternatively, the first ohmic contact layer 130b may be formed by depositing an additional layer on the first semiconductor layer 130a. Examples of a material that may be used for such an additional layer may include Te, Se, etc.

The first circuit transistor TR1 includes a second gate electrode G2 connected to a control signal line L1, a second source electrode S2 connected to an input signal line L2, a second drain electrode D2 connected to an output signal line L3, and a second semiconductor pattern AP2. The second semiconductor pattern AP2 is formed from substantially the same material as the first semiconductor pattern AP1. Thus, the second semiconductor pattern AP2 may be formed with the first semiconductor pattern AP1 through the same process. The first circuit transistor TR1 is substantially the same as the pixel transistor PSW except that the first circuit transistor TR1 is connected to a different signal line and is formed in the peripheral area PA of the display substrate 101. Thus, duplicative explanation is omitted. The first and second circuit transistors TR1 and TR2 have a semiconductor pattern that includes an amorphous multi-elements compound. Thus, a driving speed of the first and second circuit transistors TR1 and TR2 may be increased.

The first insulating layer 120 is formed on a base substrate 110 having the first and second gate electrode G1 and G2. Examples of a material that may be used for the insulating layer 120 may include silicon nitride or an oxide including at least one of silicon oxide, aluminum oxide, titanium oxide, tantalum oxide and zirconium oxide. Furthermore, the first insulating layer 120 may have a structure that includes an oxide layer and a nitride layer. The first insulating layer 120 directly contacts the first and second semiconductor patterns AP1 and AP2. However, the nitride or the oxide of first insulating layer 120 does not chemically react with the first or second semiconductor patterns AP1 and AP2, which prevents deterioration of the quality of the first and second semiconductor patterns AP1 and AP2. When, unlike the exemplary embodiments of the present disclosure, an oxide semiconductor is used for a channel layer of a thin film transistor, the quality of the semiconductor pattern may be deteriorated due to reduction between the channel layer and an insulating layer.

A second insulating layer 140 is formed on the base substrate 110 having the first and second source electrodes S1 and S2, and the first and second drain electrodes D1 and D2. The second insulating layer 140 may include silicon nitride or an oxide including at least one of silicon oxide, aluminum oxide, titanium oxide, tantalum oxide and zirconium oxide. Furthermore, the second insulating layer 140 may have a structure that includes an oxide layer and a nitride layer.

The pixel electrode PE is formed on the second insulating layer 140. The pixel electrode PE makes contact with the first drain electrode D1 via contact holes formed through the first and second insulating layers 120 and 140. Thus, the pixel transistor PSW is electrically connected to the pixel electrode PE. When the electrical conductivity of the first semiconductor pattern AP1 is increased, the mobility of electrons moving to the first drain electrode D1 through the first source electrode S1 is increased, so that RC delay is reduced. As a result of a reduction in RC delay, the pixel electrode PE may be fully charged with a desired amount of electric charge.

Figure 4:
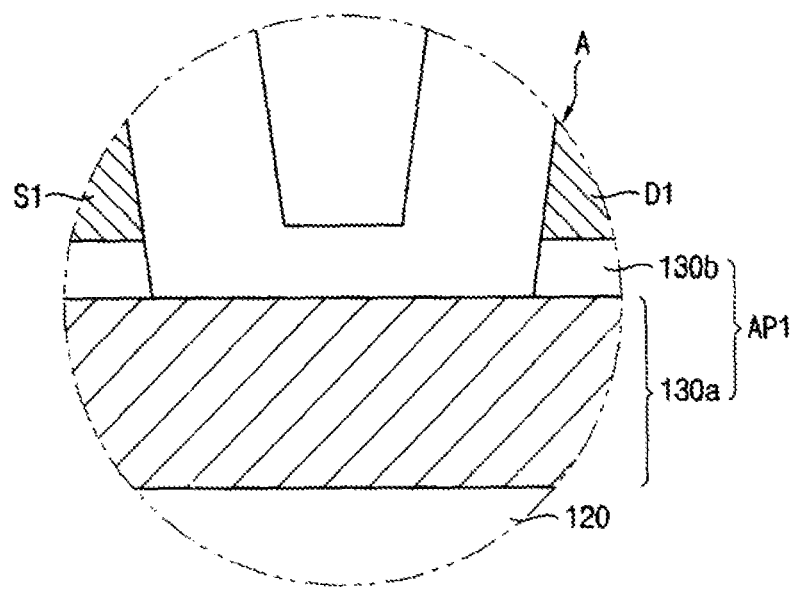
FIG. 4 is an enlarged cross-sectional view illustrating region 'A' of FIG. 2.

FIG. 4 is an enlarged cross-sectional view illustrating region 'A' of FIG. 2.

Referring to FIG. 4, the multi-element compound of the first semiconductor pattern AP1 has an amorphous phase. Thus, the first semiconductor pattern AP1 does not have a grain defined as a lattice formed by the multi-element compound. Because the first semiconductor pattern AP1 includes the multi-element compound in an irregular arrangement, the grain size of the first semiconductor pattern AP1 is close to 0 nm. Even if the multi-element compound has an amorphous phase, because the multi-element compound has a bond similar to an ionic bond, the multi-element compound may increase a driving speed of the pixel transistor PSW, the first circuit transistor TR1 and the second circuit transistor TR2 as compared to a covalently bonded compound having an amorphous phase.

Figure 5A:
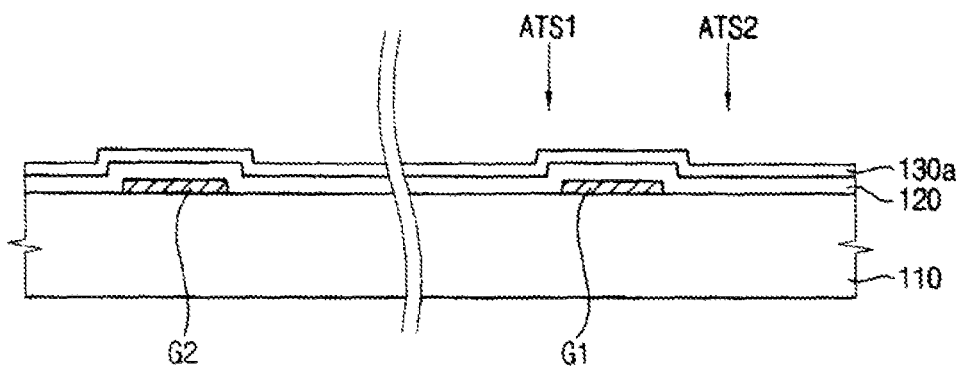
FIGS. 5A and 5B are cross-sectional views illustrating a method of manufacturing the display substrate illustrated in FIG. 3.
Figure 5B:
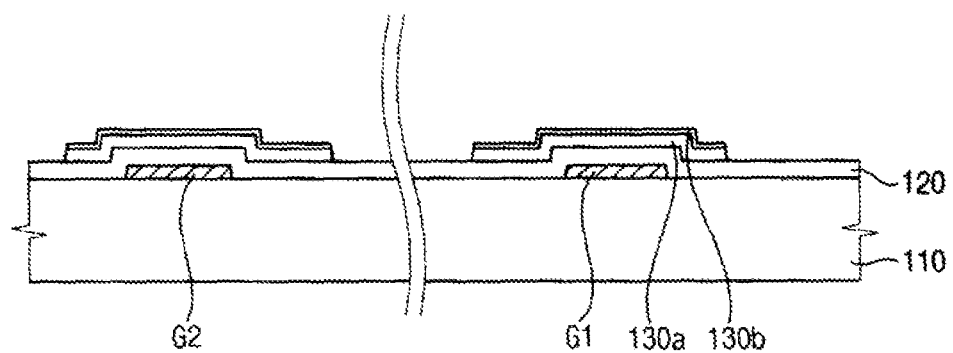

Hereinafter, a method of manufacturing a display substrate according to an example embodiment is described with reference to. FIGS. 3, 5A and 5B.

FIGS. 5A and 5B are cross-sectional views illustrating a method of manufacturing the display substrate illustrated in FIG. 3.

Referring to FIG. 5A, the first and second gate electrodes G1 and G2 are formed on the base substrate 110. The first insulating layer 120 is formed on the base substrate 110 having the first and second gate electrodes G1 and G2.

Thereafter, the base substrate 110 having the first insulating layer 120 is disposed in a chamber for forming a thin film. A source of the multi-elements compound is provided to the base substrate 110 in the chamber. The source includes a compound containing elements for forming the multi-elements compound. For example, a first compound ATS1 including an element "X" and a second compound ATS2 including an element "Y" may be provided to the base substrate 110 so as to form a multi-elements compound "XY". Alternatively, the multi-elements compound itself may be used as a source, for example, compound "XY" may be used as a source for a double-elements compound. A double-elements compound, a triple-elements compound, a quadruple-elements compound, etc. may be formed depending on the source. The source may be in a liquid, a solid or a gaseous phase. A temperature of the chamber may be about 100° C. to about 500° C. The phase of the multi-elements compound layer formed from the source depends on the temperature of the chamber. Thus, the multi-elements compound layer may have an amorphous phase, a crystalline phase, or a mixed phase that includes both an amorphous phase and a crystalline phase, depending on the temperature of the chamber.

For example, when a liquid source is used, the liquid source flows along a surface of the base substrate 110 so that the liquid source may contact the base substrate 110. Alternatively, the base substrate 110 may be dipped into the liquid source that is held in a container, so that the liquid source may contact the base substrate 110. While the liquid source is in contact with the base substrate 110, the temperature of the base substrate 110 is slowly decreased, thereby forming the first semiconductor layer 130a that includes an amorphous multi-elements compound. When a solid source is used, the solid source is provided to the base substrate 110 through, for example, a pulse laser deposition (PLD) method, a thermal evaporation method, molecular beam epitaxy (MBE) method, or a sputtering method to form the first semiconductor layer 130a. When a gas source is used, the gas source is provided to the base substrate 110 through, for example, chemical a vapor deposition (CVD) method, a metal-organic chemical vapor deposition (MOCVD) method or an atomic layer deposition (ALD) method to form the first semiconductor layer 130a. Alternatively, the first semiconductor layer 130a may be formed through a process using a plasma, for example, a plasma enhanced chemical vapor deposition (PECVD) method, a plasma enhanced metal-organic chemical vapor deposition (PEMOCVD) method, etc. When a plasma is used, the first semiconductor layer 130a may be formed at a relatively low temperature as compared to methods not using plasma.

According to the example embodiment, the amorphous multi-elements compound may be easily formed on the base substrate 110 by controlling the temperature of the chamber. The above-mentioned methods are used for forming a thin film on a large-sized substrate. Thus, the example embodiment of the present invention may easily form the first semiconductor layer 130a on a large-sized substrate.

Referring to FIG. 5B, the first ohmic contact layer 130b is formed on the base substrate 110 having the first semiconductor layer 130a. The first ohmic contact layer 130b may be an individual layer formed independently from the first semiconductor layer 130a. Alternatively, the first ohmic contact layer 130b may be formed by implanting an impurity into a surface of the first semiconductor layer 130a.

The first semiconductor layer 130a and the first ohmic contact layer 130b are patterned to form the first and second semiconductor patterns AP1 and AP2. The first semiconductor pattern AP1 is overlapped with the first gate electrode G1, and the second semiconductor pattern AP2 is overlapped with the second gate electrode G2.

The first and second source electrodes S1 and S2 and the first and second drain electrodes D1 and D2 are formed on the base substrate 110 having the first and second semiconductor patterns AP1 and AP2. For example, a metal layer, referred to herein as a data metal layer, is formed on the base substrate 110 having the first and second semiconductor patterns AP1 and AP2, and then patterned to form the first and second source electrodes S1 and S2 and the first and second drain electrodes D1 and D2. The first source electrode S1 and the first drain electrode D1 are overlapped with the first semiconductor pattern AP1. The second source electrode S2 and the second drain electrode D2 are overlapped with the second semiconductor pattern AP2. The data metal layer may include a metal, and examples of the metal for the data metal layer may include Cr, Al, Mo, Ti, Cu, etc. These may be used each alone or in a combination thereof. The data metal layer may include an organic material or an inorganic material, which is conductive. Examples of the organic materials that may be used for the data metal layer include conductive polymers such as poly(sulfurnitrile), polypyrrole, poly(p-phenylene), poly(phenylenesulfide), polyaniline, poly(p-phenylenevinylene). Examples of the inorganic material that may be used for the data metal layer include a carbon nano-tube (CNT), etc.

The second insulating layer 140 is formed on the base substrate 110 having the first and second source electrodes S1 and S2 and the first and second drain electrodes D1 and D2. The first and second insulating layers 120 and 140 on the first drain electrode D1 are partially removed to form the contact hole. The pixel electrode PE is formed on the base substrate 110 having the first and second insulating layers 120 and 140 having the contact hole. Accordingly, the display substrate 101 is manufactured.

According to the example embodiment, the amorphous multi-elements compound may be uniformly formed on a large-sized base substrate, and the semiconductor pattern having the amorphous multi-elements compound may improve a driving speed of the pixel transistor PSW, the first circuit transistor TR1 and the second circuit transistor TR2 as compared to a semiconductor pattern having a covalent bond compound. Furthermore, the first and second semiconductor patterns AP1 and AP2 having the multi-elements compound do not react with the first insulating layer 120, unlike an oxide semiconductor, thereby preventing characteristics of the first and second semiconductor patterns AP1 and AP2 from being adversely altered. Therefore, driving reliability of the pixel transistor PSW, the first circuit transistor TR1 and the second circuit transistor TR2 may be improved, and productivity of the display substrate 101 may be improved.

Exemplary Embodiment 2

A display substrate 102 according to an example embodiment is substantially the same as the display substrate 101 illustrated in FIGS. 1 to 3 except a third semiconductor pattern AP3 is used in place of first semiconductor pattern AP1 Therefore, the display substrate 102 is described more fully with reference to. FIGS. 1 to 3 and 6, and duplicative explanation will be omitted.

Figure 6:
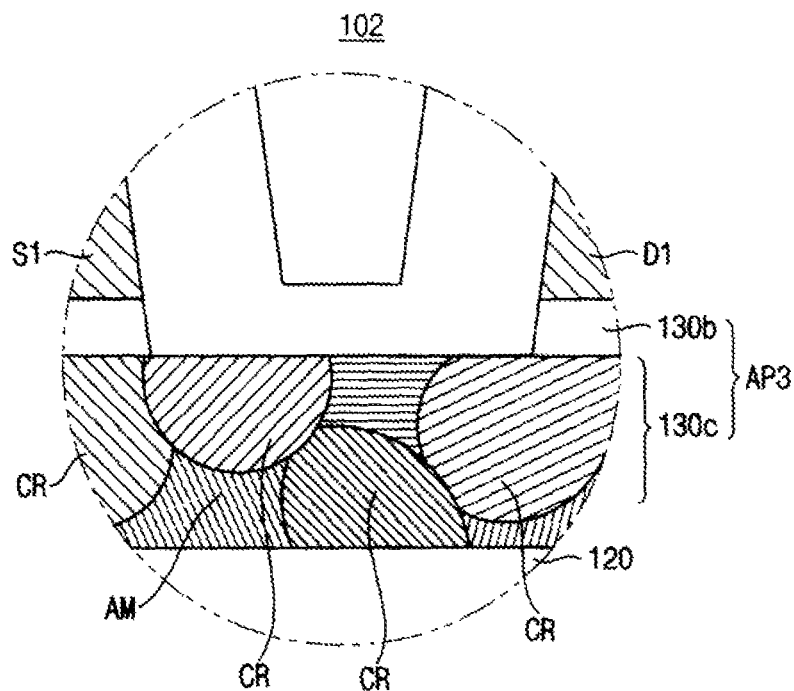
FIG. 6 is an enlarged cross-sectional view illustrating the display substrate according to Exemplary Embodiment 2.

FIG. 6 is an enlarged cross-sectional view illustrating the display substrate according to Exemplary Embodiment 2.

Referring to FIGS. 1, 2 and 6, the display substrate 102 includes a pixel transistor PSW formed in a display area DA. The pixel transistor PSW includes a third semiconductor pattern AP3. The third semiconductor pattern AP3 includes a second semiconductor layer 130c and a first ohmic contact layer 130b.

The second semiconductor layer 130c includes a multi-elements compound having an amorphous phase and a crystalline phase. Thus, the multi-elements compound has a mixed phase that includes the amorphous phase and the crystalline phase in the second semiconductor layer 130c. A ratio of the amorphous phase to the crystalline phase in the second semiconductor layer 130c may be about 1:99 to about 99:1. The crystalline phase is defined as a polycrystal that comprises a plurality of grains. In FIG. 6, the grain is represented by CR, and the amorphous phase is represented by AM.

As illustrated in FIG. 6, the second semiconductor layer 130c includes the grain CR and the amorphous phase AM. The grain CR is formed by elements of the multi-elements compound regularly arranged, and a grain boundary is formed between adjacent grains CR that are arranged in different directions. Furthermore, when the amorphous phase AM is disposed between adjacent grains CR, a grain boundary is formed between the amorphous phase AM and adjacent grains CR. A grain size of each grains CR may be in the range of about 0.1 nm to 100 μm. Typically, the grain size may be 0.1 nm to 1 μm.

The second semiconductor layer 130c further includes a crystalline multi-elements compound as compared to the first semiconductor layer 130a. Thus, the second semiconductor layer 130c may have a relatively higher degree of electron mobility as compared to the first semiconductor layer 130a. Therefore, an electron may move faster in the multi-elements compound having the mixed phase than in the multi-elements compound having an amorphous phase.

A method for manufacturing the display substrate 102 is substantially the same as the method for manufacturing the display substrate 101 illustrated in FIGS. 5A and 5B except for the temperature of the chamber used for forming the second semiconductor layer 130c. Thus, duplicative explanation will be omitted. The temperature of the chamber used for forming the second semiconductor layer 130c may be higher than a temperature that would be used for forming the first semiconductor layer 130a in which the multi-elements compound is in the amorphous state. That is, for a particular multi-elements compound, a second temperature is used for forming the second semiconductor layer 130c is higher than a first temperature used for forming the first semiconductor layer 130a. For example, the second temperature may be about 100° C. to about 500° C.

Alternatively, the second semiconductor layer 130c may be formed by applying laser light to a preliminary layer that is substantially the same as the first semiconductor layer 130a illustrated in FIG. 5A. For example, a preliminary layer that includes an amorphous multi-elements compound is formed on the base substrate 110, and the preliminary layer is irradiated with light from a laser to crystallize a portion of the amorphous multi-elements compound. As the length of time the laser light is applied to the preliminary layer increases, the grain size in the crystalline phase is increased. Accordingly, the second semiconductor layer 130c in which the multi-elements compound has mixed amorphous crystalline phases may be formed.

According to the example embodiments, a multi-elements compound that has a mixture of amorphous phase and crystalline phases may be easily formed without an additional process for crystallization. Thus, driving reliability of the pixel transistor PSW, the first circuit transistor TR1 and the second circuit transistor TR2 may be improved, and productivity of the display substrate 102 may be improved.

Exemplary Embodiment 3

A display substrate 103 according to an example embodiment is substantially the same as the display substrate 101 illustrated in FIGS. 1 to 3 except a fourth semiconductor pattern AP4 is used in place of first semiconductor pattern AP1 Therefore, the display substrate 103 is described more fully with reference to FIGS. 1 to 3 and 7, and duplicative explanation will be omitted.

Figure 7:
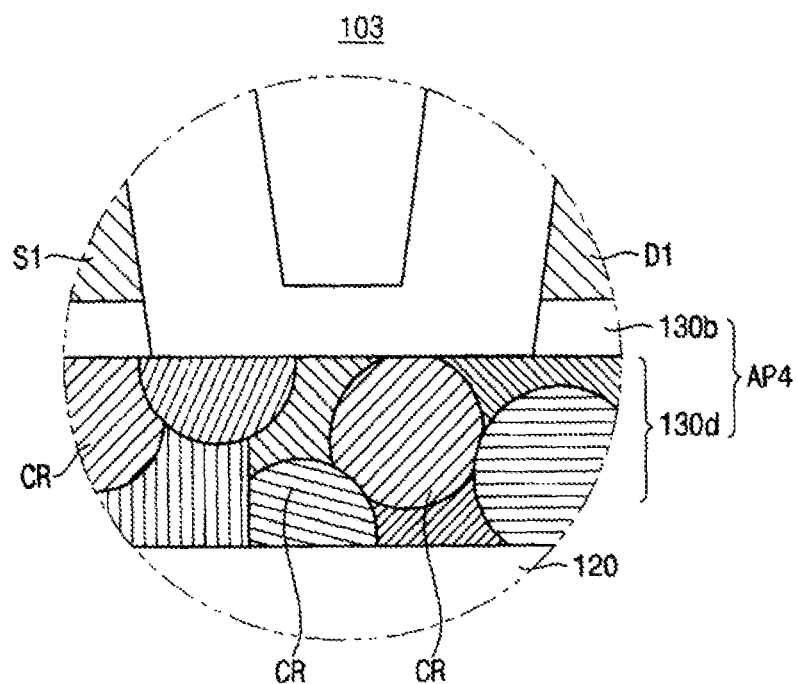
FIG. 7 is an enlarged cross-sectional view illustrating the display substrate according to Exemplary Embodiment 3.

FIG. 7 is an enlarged cross-sectional view illustrating the display substrate according to Embodiment 3.

Referring to FIGS. 1, 2 and 7, the display substrate 103 includes a pixel transistor PSW formed in a display area DA. The pixel transistor PSW includes a fourth semiconductor pattern AP4. The fourth semiconductor pattern AP4 includes a third semiconductor layer 130d and a first ohmic contact layer 130b.

The third semiconductor layer 130d includes a multi-elements compound having a crystalline phase. The crystalline phase is defined as a polycrystal that comprises a plurality of grains. In FIG. 7, the grain is represented by CR. A grain size of each grains CR is in the range of 0.1 nm to 1 um. The content of crystalline phase in the third semiconductor layer 130d is higher than that of the second semiconductor layer 130c. Thus, the third semiconductor layer 130d may have a greater electron mobility as compared to the second semiconductor layer 130c. The electron mobility of the third semiconductor layer 130d is preferably more than 1 $cm^2/Vs$. For example, when the third semiconductor layer 130d includes crystalline phase GaAs (gallium arsenide), an electron mobility of GaAs is more than 1 $cm^2/Vs$.

The multi-elements compound including GaAs may further include a small amount of carbon, oxygen and hydrogen elements. A content of each of the carbon, oxygen and hydrogen elements may be about $1\times10^{13}$ atoms/$cm^3$ of GaAs depending upon the characteristics of the process for forming GaAs. When the content of the carbon element is more than $1\times10^{19}$ atoms/$cm^3$ an amount of a carrier is excessively increased in GaAs so that the multi-elements compound becomes closer to a conductor than to a semiconductor. When the content of the oxygen and hydrogen elements is more than $1\times10^{19}$ atoms/$cm^3$, an amount of an impurity becomes more than the carrier in GaAs so that the carrier is hindered from moving, thereby deteriorating the characteristics of the multi-elements compound. Thus, the content of each of the carbon, oxygen and hydrogen elements may be preferably about $1\times10^{13}$ atoms/$cm^3$ to $1\times10^{19}$ atoms/$cm^3$ of GaAs.

A method for manufacturing the display substrate 103 is substantially the same as the method for manufacturing the display substrate 101 illustrated in FIGS. 5A and 5B except for a temperature of a chamber for forming the third semiconductor layer 130d. Thus, duplicative explanation will be omitted. The temperature of the chamber used for forming the third semiconductor layer 130d may be higher than a temperature that would be used for forming the first semiconductor layer 130a ion which the multi-elements compound is in the amorphous state, and higher than a temperature that would be used for forming the second semiconductor layer 130c having a mixes amorphous and crystalline state. That is, for a particular multi-elements compound, a third temperature is used for forming the third semiconductor layer 130d is higher than both a first temperature used for forming the first semiconductor layer 130a and a second temperature used for forming the second semiconductor layer 130c. For example, the third temperature may be about 100° C. to about 500° C.

Alternatively, the third semiconductor layer 130d may be formed by applying laser light to a preliminary layer that is substantially the same as the first semiconductor layer 130*a* illustrated in FIG. 5A. For example, a preliminary layer that includes an amorphous multi-elements compound is formed on the base substrate 110, and the preliminary layer is irradiated with light from a laser to crystallize the amorphous multi-elements compound. Thus, the third semiconductor layer 130*d* in which the multi-elements compound has a crystalline phase may be formed. As the length of time the laser light is applied to the preliminary layer increases, the proportion of a crystalline phase in the multi-elements compound is increased.

According to the example embodiments, the multi-elements compound having a crystalline phase may be easily formed without an additional process for crystallization. Thus, driving reliability of the pixel transistor PSW, the first circuit transistor TR1 and the second circuit transistor TR2 may be improved, and productivity of the display substrate 103 may be improved.

Exemplary Embodiment 4

Figure 8:
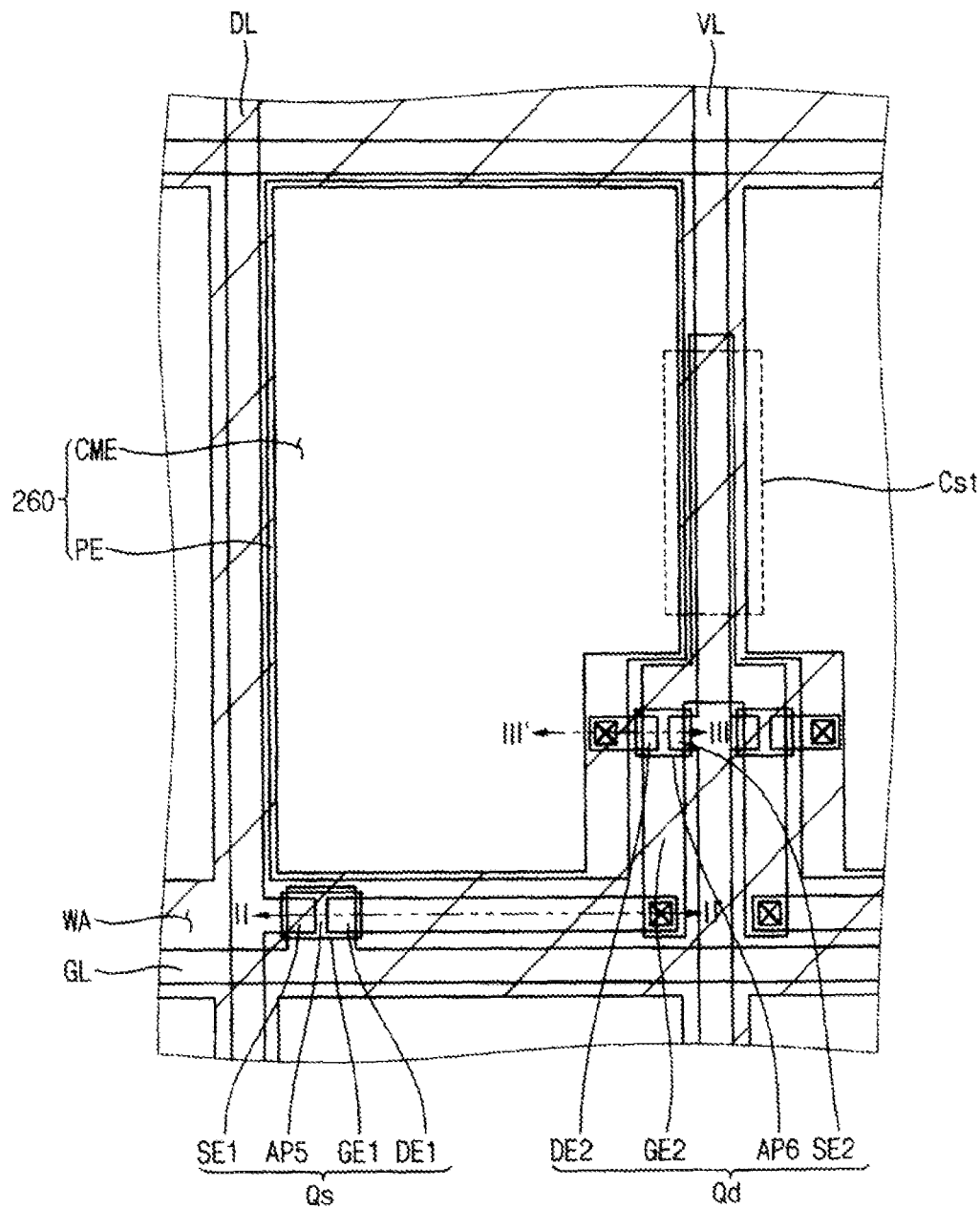
FIG. 8 is a plan view illustrating a display substrate according to Exemplary Embodiment 4 of the present invention.

FIG. 8 is a plan view illustrating a display substrate according to Exemplary Embodiment 4.

Figure 9:
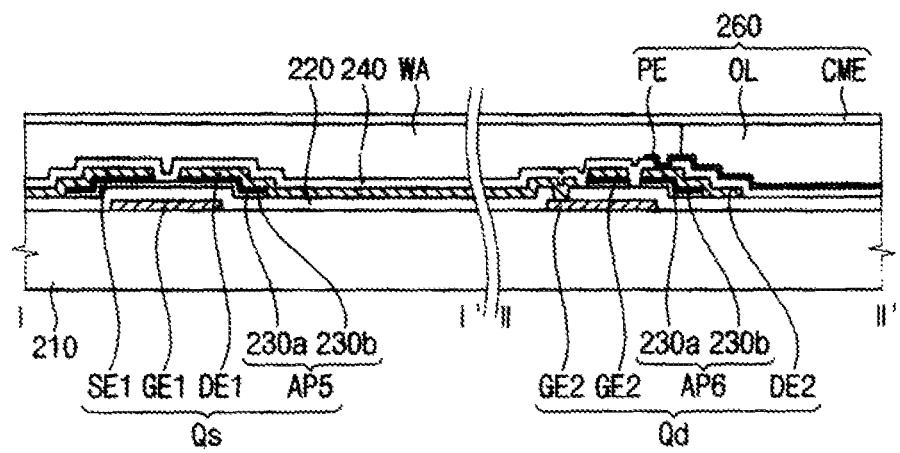
FIG. 9 is a cross-sectional view taken along lines II-II' and III-III' of FIG. 8.

FIG. 9 is a cross-sectional view taken along lines II-II' and III-III' of FIG. 8.

Referring to FIGS. 8 and 9, a display substrate 201 includes a gate line GL, a data line DL, a power supplying line VL, a switching transistor Qs, a driving transistor Qd, a storage capacitor Cst, a partition wall WA and an electric luminescence element 260. Each of the switching transistor Qs and the driving transistor Qd is a thin film transistor.

The switching transistor Qs is electrically connected to the gate line GL and the data line DL. The switching transistor Qs includes a switching gate electrode GE1, a switching source electrode SE1, a switching drain electrode DE1 and a fifth semiconductor pattern AP5. The fifth semiconductor pattern AP5 is formed on a third insulating layer 220 on the switching gate electrode GE1 The fifth semiconductor pattern AP5 includes a fourth semiconductor layer 230*a* and a second ohmic contact layer 230*b*. The fourth semiconductor layer 230*a* may include a multi-elements compound having a mixture of amorphous phase and crystalline phase. The fourth semiconductor layer 230*a* is substantially the same as the second semiconductor layer 130*c* illustrated in FIG. 6. Furthermore, the second ohmic contact layer 230*b* is substantially the same as the first ohmic contact layer 130*b*. Thus, duplicative explanation will be omitted.

The driving transistor Qd is electrically connected to the switching transistor Qs and the power supplying line VL. The driving transistor Qd includes a driving gate electrode GE2, a driving source electrode SE2, a driving drain electrode DE2 and a sixth semiconductor pattern AP6. The driving gate electrode GE2 is electrically connected to the switching drain electrode DE1. The sixth semiconductor pattern AP6 is formed on the third insulating layer 220 on the driving gate electrode GE2. The sixth semiconductor pattern AP6 is substantially the same as the fifth semiconductor pattern AP5. Thus, duplicative explanation will be omitted.

The driving transistor Qd needs to provide a relatively large amount of electrons to the electric luminescence element 260 as compared to the switching transistor Qs. According to the exemplary embodiment, the driving transistor Qd has the sixth semiconductor pattern AP6, which includes the multi-elements compound. Thus, a sufficient amount of electrons may be provided to the electric luminescence element 260 through the sixth semiconductor pattern AP6, which has a high degree of electron mobility.

The electric luminescence element 260 includes a pixel electrode PE that is electrically connected to the driving transistor Qd, a light emitting layer OL and a cathode CME. The pixel electrode PE functions as an anode of the electric luminescence element 260, and provides a hole to the light emitting layer OL. The cathode CME provides an electron to the light emitting layer OL, and the hole and the electron are combined with each other in the light emitting layer OL to generate an exciton. The pixel electrode PE may be, for example, a reflective electrode, and the cathode CME may be a transparent electrode. Alternatively, the pixel electrode PE may be a transparent electrode, and the cathode CME may be a reflective electrode.

A fourth insulating layer 240 is formed on the base substrate 210 having the switching source electrode SE1, the switching drain electrode DE1, the driving source electrode SE2 and the driving drain electrode DE2. The partition wall WA is formed on the fourth insulating layer 240 on the gate line GL, the data line DL, the switching transistor Qs and the driving transistor Qd. The partition wall WA exposes a portion of the pixel electrode PE. The light emitting layer OL is formed on the pixel electrode PE that is exposed through the partition wall WA, and the cathode CME is formed to make a contact with the partition wall WA and the light emitting layer OL.

Figure 10A:
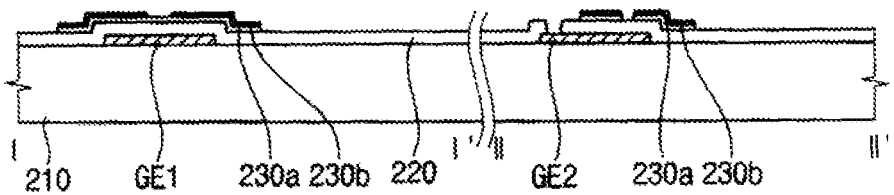
FIGS. 10A and 10B are cross-sectional views illustrating a method for manufacturing the display substrate illustrated in FIG. 9.
Figure 10B:
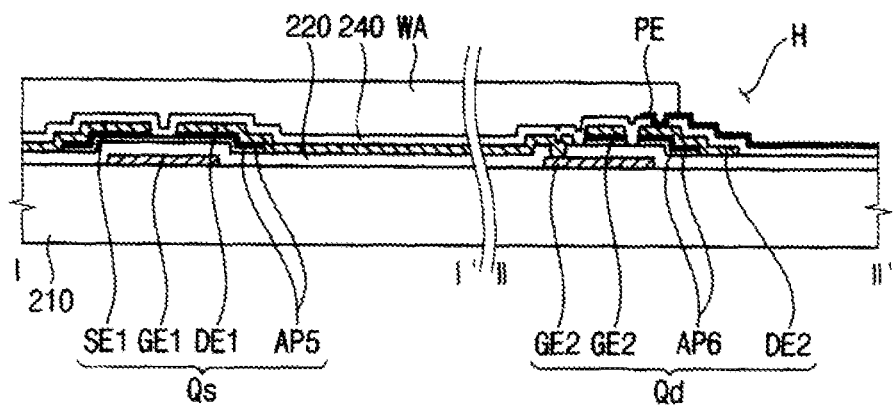

FIGS. 10A and 10B are cross-sectional views illustrating a method for manufacturing the display substrate illustrated in FIG. 9.

Referring to FIG. 10A, the switching gate electrode GE1 and the driving gate electrode GE2 are formed on the base substrate 210. The third insulating layer 220 is formed on the base substrate 210 having the switching gate electrode GE1 and the driving gate electrode GE2.

The fifth and sixth semiconductor patterns AP5 and AP6 are formed on the third insulating layer 220. Processes for forming the fifth and sixth semiconductor patterns AP5 and AP6 are substantially the same as the processes for forming the third semiconductor pattern AP3 explained above with respect to Exemplary Embodiment 2. Thus, duplicative explanation will be omitted. According to the example embodiment, the fifth semiconductor patterns AP5 of the switching transistor Qs and the six semiconductor patterns AP6 of the driving transistor Qd may be formed on a large-sized substrate by the same process by using the multi-elements compound.

Referring to FIG. 10B, the switching source electrode SE1, the switching drain electrode DE1, the driving source electrode SE2 and the driving drain electrode DE2 are formed on the base substrate 210 that has the fifth and sixth semiconductor patterns AP5 and AP6. Thereafter, the fourth insulating layer 240, the pixel electrode PE and the partition wall WA are sequentially formed, and the light emitting layer OL is formed in a hole H of the partition wall WA. The cathode CME is formed on the base substrate 210 that has the light emitting layer OL.

According to the example embodiment, the multi-elements compound having a mixture of amorphous and crystalline phases may be easily formed without an additional process for crystallization. Thus, driving reliability of the switching transistor Qs and the driving transistor Qd may be improved, and productivity of the display substrate 201 may be improved. Particularly, electrical characteristics of the driving transistor Qd connected to the electric luminescence element 260 for driving the electric luminescence element 260 may be improved.

In the exemplary embodiment, the fifth and sixth semiconductor patterns AP5 and AP6 include the multi-elements compound having the mixture of amorphous and crystalline phases. However, each of the fifth and sixth semiconductor patterns AP5 and AP6 may include an amorphous multi-elements compound, or a crystalline multi-elements compound.

Hereinafter, a thin film transistor having a different structure from the above-explained thin film transistor is described with reference to the following Exemplary Embodiments 5, 6 and 7. Hereinafter, a structure of a pixel transistor is described, however, the structure of the pixel transistor may be applied to the first and second circuit transistors TR1 and TR2 illustrated in FIGS. 1 and 2, and the switching and driving transistors Qs and Qd illustrated in FIGS. 8 and 9.

Exemplary Embodiment 5

Figure 11:
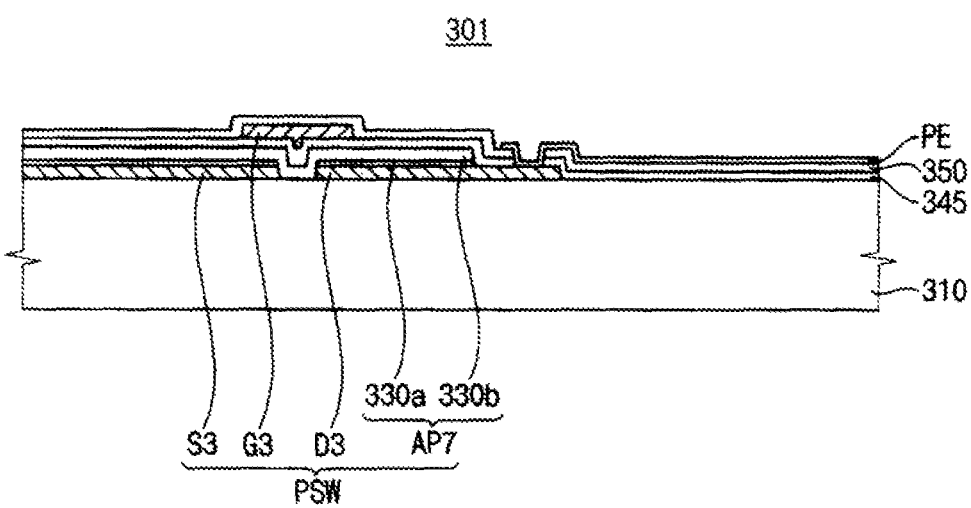
FIG. 11 is a cross-sectional view illustrating a display substrate according to Exemplary Embodiment 5 of the present invention.

FIG. 11 is a cross-sectional view illustrating a display substrate according to Exemplary Embodiment 5.

Referring to FIG. 11, a display substrate 301 includes a pixel electrode PE and a pixel transistor PSW. The pixel transistor PSW includes a third source electrode S3, a third drain electrode D3, a seventh semiconductor pattern AP7 and a third gate electrode G3.

The third source electrode S3 and the third drain electrode D3 are formed on a base substrate 310. The seventh semiconductor pattern AP7 is formed on the third source electrode S3 and the third drain electrode D3. The seventh semiconductor pattern AP7 includes a fifth semiconductor layer 330b and a third ohmic contact layer 330a. The third ohmic contact layer 330a is formed under the fifth semiconductor layer 330b. The fifth semiconductor layer 330b may include a multi-elements compound having a mixture of amorphous phase and crystalline phase. Alternatively, the fifth semiconductor layer 330b may include an amorphous multi-elements compound, or a crystalline multi-elements compound.

A fifth insulating layer 345 is formed on the seventh semiconductor pattern AP7. The third gate electrode G3 is formed on the fifth insulating layer 345. A sixth insulating layer 350 is formed on the third gate electrode G3, and the pixel electrode PE is formed on the sixth insulating layer 350.

Figure 12A:
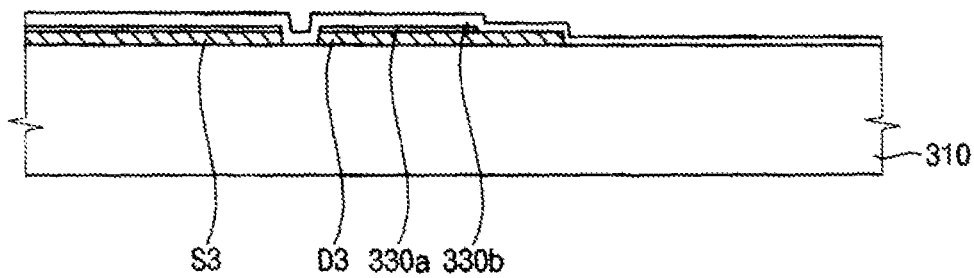
FIGS. 12A and 12B are cross-sectional views illustrating a method of manufacturing the display substrate illustrated in FIG. 11.
Figure 12B:
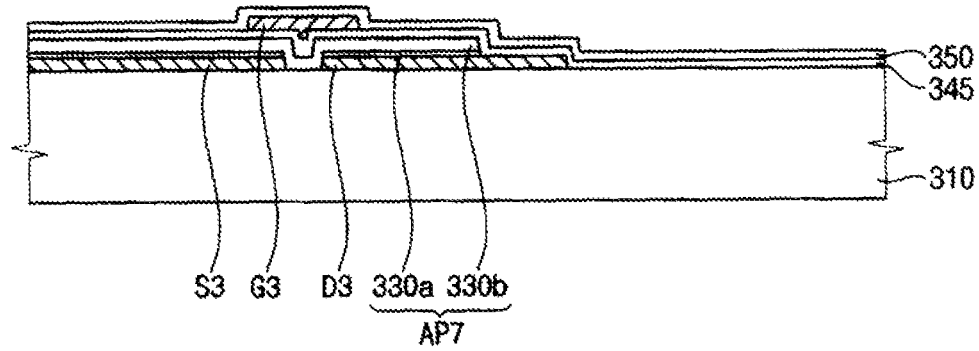

FIGS. 12A and 12B are cross-sectional views illustrating a method of manufacturing the display substrate illustrated in FIG. 11.

Referring to FIG. 12A, the third source electrode S3 and the third drain electrode D3 are formed on the base substrate 310. The third ohmic contact layer 330a is formed on the base substrate having the third source electrode S3 and the third drain electrode D3. Examples of a material that may be used for the ohmic contact layer 330a may include Te or Se. The fifth semiconductor layer 330b is formed on the base substrate 310 having the third ohmic contact layer 330a. Processes for forming the fifth semiconductor layer 330b are substantially the same as the processes for forming the second semiconductor layer 130c described above with respect to Exemplary Embodiment 2, except that the base substrate 310, on which the fifth semiconductor layer 330b is formed, has the third ohmic contact layer 330a. Thus, duplicative explanation will be omitted.

Referring to FIG. 12b, the fifth insulating layer 345 is formed on the seventh semiconductor pattern AP7 having the fifth semiconductor layer 330b. The third gate electrode G3 is formed on the base substrate 310 having the fifth insulating layer 345. The sixth insulating layer 350 is formed on the third gate electrode G3, and the pixel electrode PE is formed.

In the exemplary embodiment, the seventh semiconductor pattern AP7 includes multi-elements compound having a mixture of amorphous phase and crystalline phase. However, the seventh semiconductor pattern AP7 may include an amorphous multi-elements compound, or a crystalline multi-elements compound.

Exemplary Embodiment 6

Figure 13:
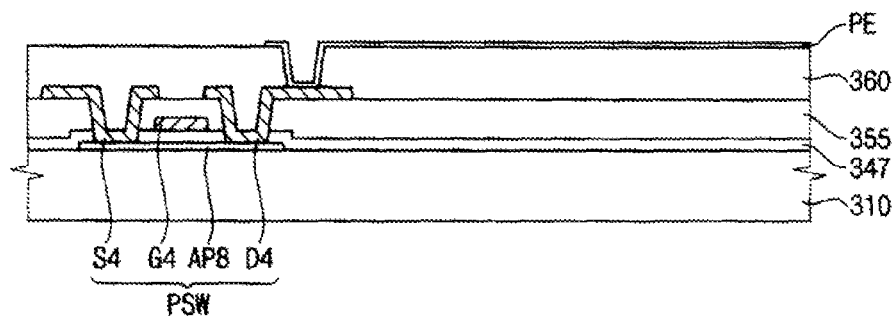
FIG. 13 is a cross-sectional view illustrating a display substrate according to Exemplary Embodiment 6 of the present invention.

FIG. 13 is a cross-sectional view illustrating a display substrate according to Exemplary Embodiment 6.

Referring to FIG. 13, a display substrate 302 includes a pixel electrode PE and a pixel transistor PSW. The pixel transistor PSW includes a fourth source electrode S4, a fourth drain electrode D4, an eighth semiconductor pattern AP8 and a fourth gate electrode G4.

The eighth semiconductor pattern AP8 is formed on a base substrate 310. The eighth semiconductor pattern AP8 is substantially the same as the seventh semiconductor pattern AP7 illustrated in FIG. 11, except for the location of the eighth semiconductor pattern AP8 in the display substrate. Thus, duplicative explanation will be omitted. The eighth semiconductor pattern AP8 may include only the fifth semiconductor layer 330b, as illustrated in FIG. 11, without the third ohmic contact layer 330a. A seventh insulating layer 347 is formed on the eighth semiconductor pattern AP8.

The fourth gate electrode G4 is formed on the seventh insulating layer 347. An eighth insulating layer 355 is formed on the fourth gate electrode G4, and the fourth source electrode S4 and the fourth drain electrode D4 are formed on the eighth insulating layer 355. The fourth source electrode S4 and the fourth drain electrode D4 directly contacts the eighth semiconductor pattern AP8 via holes formed through the seventh and eighth insulating layers 347 and 355. A ninth insulating layer 360 is formed on the fourth source electrode S4 and the fourth drain electrode D4. The fourth drain electrode D4 is exposed via a hole formed through the ninth insulating layer 360 and thus makes contact with the pixel electrode PE.

Figure 14A:
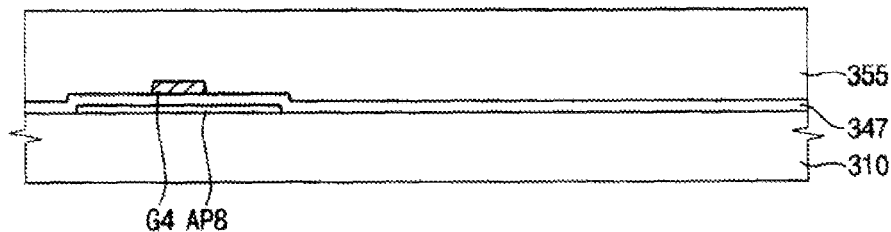
FIGS. 14A and 14B are cross-sectional views illustrating a method of manufacturing the display substrate illustrated in FIG. 13.
Figure 14B:
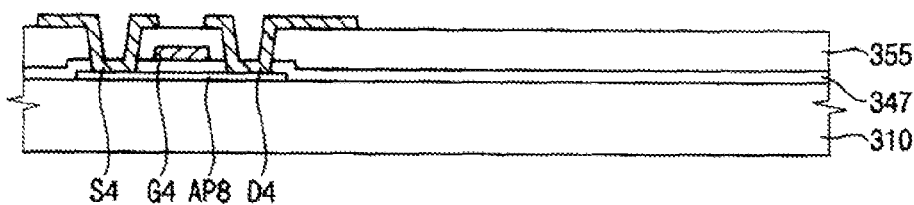

FIGS. 14A and 14B are cross-sectional views illustrating a method of manufacturing the display substrate illustrated in FIG. 13.

Referring to FIG. 14A, the eighth semiconductor pattern AP8 is formed on the base substrate 310. Processes for forming the eighth semiconductor pattern AP8 are substantially the same as the processes for forming the fifth semiconductor layer 330b illustrated in FIG. 12A, except that the eighth semiconductor pattern AP8 is formed directly on the base substrate 310. Thus, duplicative explanation will be omitted.

The seventh insulating layer 347 is formed on the base substrate 310 having the eighth semiconductor pattern AP8, and the fourth gate electrode G4 is formed on the seventh insulating layer 347. Thereafter, the eighth insulating layer 355 is formed.

Referring to FIG. 14B, holes exposing a portion of the eighth semiconductor pattern AP8 are formed through the seventh and eighth insulating layers 347 and 355. Thereafter, the fourth source electrode S4 and the fourth drain electrode D4 are formed on the eighth insulating layer 355. Thereafter, the ninth insulating layer 360 is formed on the fourth source electrode S4 and the fourth drain electrode D4, and the pixel electrode PE is formed on the ninth insulating layer 360.

In the exemplary embodiment, the eighth semiconductor pattern AP8 includes multi-elements compound having a mixture of amorphous phase and crystalline phase. However, the eighth semiconductor pattern AP8 may include an amorphous multi-elements compound, or a crystalline multi-elements compound.

Exemplary Embodiment 7

Figure 15:
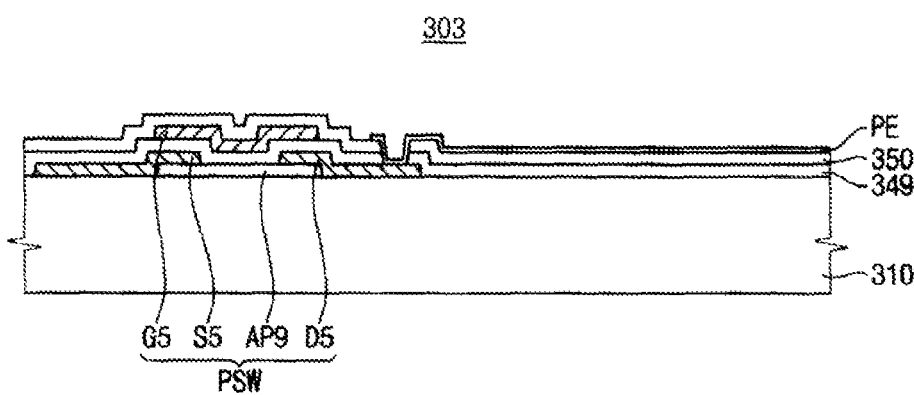
FIG. 15 is a cross-sectional view illustrating a display substrate according to Exemplary Embodiment 7 of the present invention.

FIG. 15 is a cross-sectional view illustrating a display substrate according to Exemplary Embodiment 7.

Referring to FIG. 15, a display substrate 303 includes a pixel electrode PE and a pixel transistor PSW. The pixel transistor PSW includes a fifth source electrode S5, a fifth drain electrode D5, a ninth semiconductor pattern AP9 and a fifth gate electrode G5.

The ninth semiconductor pattern AP9 is formed on a base substrate 310. The ninth semiconductor pattern AP9 is substantially the same as the eighth semiconductor pattern AP8 illustrated in FIG. 13. Thus, duplicative explanation will be omitted. The ninth semiconductor pattern AP9 may include only the fifth semiconductor layer 330b illustrated in FIG. 11, without the third ohmic contact layer 330a.

The fifth source electrode S5 and the fifth drain electrode D5 are formed on the ninth semiconductor pattern AP9. A tenth insulating layer 349 is formed on the fifth source electrode S5 and the fifth drain electrode D5. The fifth gate electrode G5 is formed on the tenth insulating layer 349. An eleventh insulting layer 350 is formed on the fifth gate electrode G5, and the pixel electrode PE is formed on the eleventh insulting layer 350.

Figure 16A:
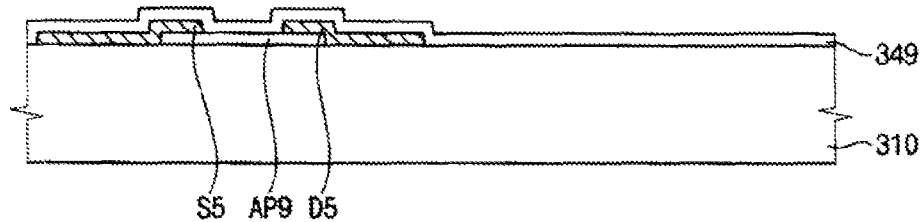
FIGS. 16A and 16B are cross-sectional views illustrating a method of manufacturing the display substrate illustrated in FIG. 15.
Figure 16B:
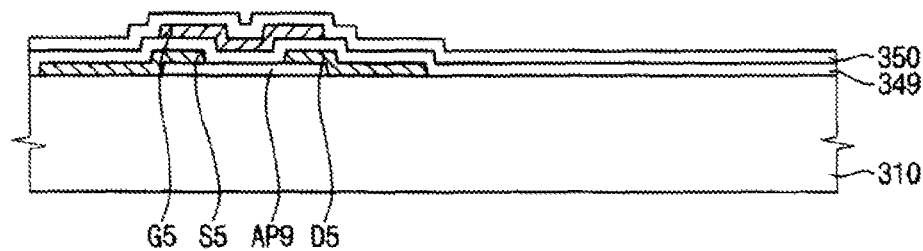

FIGS. 16A and 16B are cross-sectional views illustrating a method of manufacturing the display substrate illustrated in FIG. 15.

Referring to FIG. 16A, the ninth semiconductor pattern AP9 is formed on the base substrate 310. Processes for forming the ninth semiconductor pattern AP9 are substantially the same as the processes for forming the eighth semiconductor pattern AP8. Thus, duplicative explanation will be omitted.

The fifth source electrode S5 and the fifth drain electrode D5 are formed on the base substrate 310 having the ninth semiconductor pattern AP9. The tenth insulating layer 349 is formed on the base substrate 310 having the fifth source electrode S5 and the fifth drain electrode D5.

Referring to FIG. 16B, the fifth gate electrode G5 and the eleventh insulating layer 350 are sequentially formed on the base substrate 310 having the tenth insulating layer 349. After holes exposing a portion of the fifth drain electrode D5 are formed through the tenth insulating layer 349 and the eleventh insulting layer 350, the pixel electrode PE is formed on the eleventh insulting layer 350.

In the exemplary embodiment, the ninth semiconductor pattern AP9 includes a multi-elements compound having a mixture of amorphous phase and a crystalline phase. However, the ninth semiconductor pattern AP9 may include an amorphous multi-elements compound, or a crystalline multi-elements compound.

Exemplary Embodiment 8

Figure 17:
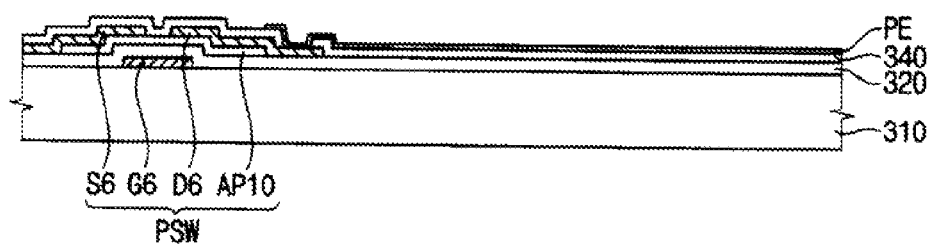
FIG. 17 is a cross-sectional view illustrating a display substrate according to Exemplary Embodiment 8 of the present invention.

FIG. 17 is a cross-sectional view illustrating a display substrate according to Exemplary Embodiment 8.

Referring to FIG. 17, a display substrate 304 includes a pixel electrode PE and a pixel transistor PSW. The pixel transistor PSW includes a sixth source electrode S6, a sixth drain electrode D6, a tenth semiconductor pattern AP10 and a sixth gate electrode G6. The pixel transistor PSW is substantially the same as the pixel transistor PSW illustrated in FIG. 3, except for the tenth semiconductor pattern AP10. Thus, duplicative explanation will be omitted.

The tenth semiconductor pattern AP10 directly contacts a first insulating layer 320 that covers the sixth gate electrode G6 because an ohmic contact layer is omitted. The sixth source electrode S6 and the sixth drain electrode D6 include a semiconductor layer formed on the tenth semiconductor pattern AP10, and make a contact with the tenth semiconductor pattern AP10. The semiconductor layer includes an amorphous multi-elements compound. A second insulating layer 340 is formed on the pixel transistor PSW, and the pixel electrode PE is formed on the second insulating layer 340.

A method of manufacturing the display substrate 304 illustrated in FIG. 17 is substantially the same as the method for manufacturing the display substrate 101 illustrated in FIG. 3, except that the process for forming the first ohmic contact layer 130b (illustrated in FIG. 5 on the first semiconductor layer 130a) is omitted. Thus, duplicative explanation will be omitted.

In the exemplary embodiment, the tenth semiconductor pattern AP10 includes the amorphous multi-elements compound. However, the tenth semiconductor pattern AP10 may include a crystalline multi-elements compound, or have a mixture of amorphous and crystalline phases.

Although not illustrated, in other exemplary embodiments each of the pixel transistors PSW illustrated in FIGS. 6, 7, 9 and 11 may include only a semiconductor layer without an ohmic contact layer.

Exemplary Embodiment 9

Figure 18:
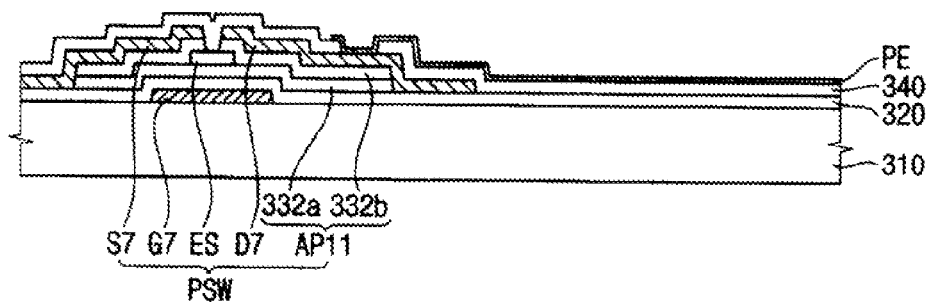
FIG. 18 is a cross-sectional view illustrating a display substrate according to Exemplary Embodiment 9 of the present invention.

FIG. 18 is a cross-sectional view illustrating a display substrate according to Exemplary Embodiment 9.

Referring to FIG. 18, a display substrate 305 includes a pixel electrode PE and a pixel transistor PSW. Pixel transistor PSW includes a seventh source electrode S7, a seventh drain electrode D7, an eleventh semiconductor pattern AP11, an etch stopper ES and a seventh gate electrode G7. The pixel transistor PSW is substantially the same as the pixel transistor PSW illustrated in FIG. 3, except for further including the etch stopper ES. Thus, duplicative explanation will be omitted.

The eleventh semiconductor pattern AP11 includes a sixth semiconductor layer 332a and a fourth ohmic contact layer 332b. Sixth semiconductor layer 332a is formed on a first insulating layer 320, which is formed on the seventh gate electrode G7. The sixth semiconductor layer 332a includes an amorphous multi-elements compound, a crystalline multi-elements compound, or a multi-elements compound having a mixture of amorphous phase and crystalline phase.

The etch stopper ES is formed between the sixth semiconductor layer 332a and the fourth ohmic contact layer 332b of the eleventh semiconductor pattern AP11. The etch stopper ES is formed from a material that is different from the material used to form the fourth ohmic contact layer 332b, thereby functioning to protect the sixth semiconductor layer 332a in the course of patterning the fourth ohmic contact layer 332b. The etch stopper ES is formed to overlap a gap between the seventh source electrode S7 and the seventh drain electrode D7.

Figure 19A:
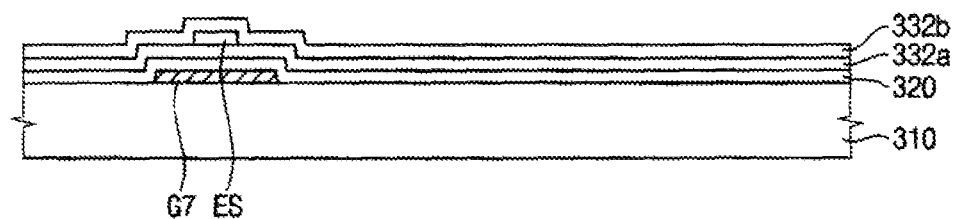
FIGS. 19A and 19B are cross-sectional views illustrating a method of manufacturing the display substrate illustrated in FIG. 18.
Figure 19B:
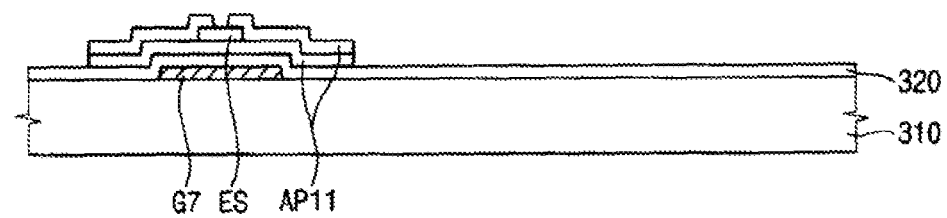

FIGS. 19A and 19B are cross-sectional views illustrating a method of manufacturing the display substrate illustrated in FIG. 18.

Referring to FIG. 19A, the seventh gate electrode G7 is formed on a base substrate 310, and the first insulating layer 320, the sixth semiconductor layer 332a, the etch stopper ES and the fourth ohmic contact layer 332b are sequentially formed on the base substrate 310 having the seventh gate electrode G7. For example, after the first insulating layer 320 and the sixth semiconductor layer 332a are sequentially formed, and a protecting layer including silicon nitride or silicon oxide is formed. Alternatively, the protecting layer may include aluminum oxide, titanium oxide, tantalum oxide, zirconium oxide, etc. The protecting layer is patterned to form the etch stopper ES. Because the protecting layer is formed from a material that is different from the material used to form the sixth semiconductor layer 332a, the sixth semiconductor layer 332a is not damaged in the process of forming the etch stopper ES. The fourth ohmic contact layer 332b is formed on the base substrate 310 having the etch stopper ES. Processes for forming the sixth semiconductor layer 332a and the fourth ohmic contact layer 332b are substantially the same as the processes illustrated in FIGS. 5A and 5B. Thus, duplicative explanation will be omitted.

Referring to FIG. 19B, the sixth semiconductor layer 332a and the fourth ohmic contact layer 332b may be patterned using the same mask to form the eleventh semiconductor pattern AP11. When the sixth semiconductor layer 332a and the fourth ohmic contact layer 332b are patterned, the sixth semiconductor layer 332a disposed under the etch stopper ES is not removed. The fourth ohmic contact layer 332b is patterned, thereby exposing the etch stopper ES.

Thereafter, the seventh source electrode S7 and the seventh drain electrode D7 are formed on the base substrate 310 having the eleventh semiconductor pattern AP11. Thereafter, a second insulating layer 340 is formed, and the pixel electrode PE is formed. The etch stopper ES is exposed between the seventh source electrode S7 and the seventh drain electrode D7.

In the example embodiment, the eleventh semiconductor pattern AP11 includes an amorphous multi-elements compound. However, the eleventh semiconductor pattern AP11 may include a crystalline multi-elements compound, or a multi-elements compound that has a mixture of amorphous phase and crystalline phase.

Hereinafter, characteristic of a semiconductor layer that includes a triple-elements compound and electrical characteristics of a thin film transistor that includes the semiconductor layer is described with reference to specific examples and experiments.

Evaluation of a Surface State Depending on a Forming Temperature

A silicon oxide layer having a thickness of about 1000 Å was formed on an N+ type silicon wafer, and a semiconductor layer including In—Ga—As having a thickness of about 180 Å was formed through metal organic chemical vapor deposition (MOCVD) method respectively at three different temperatures: about 450° C., about 300° C. and about 250° C. A surface state of the semiconductor layer including In—Ga—As prepared at each of the three temperatures was observed, and the results obtained are shown in FIGS. 20A, 20B and 20C.

Figure 20A:
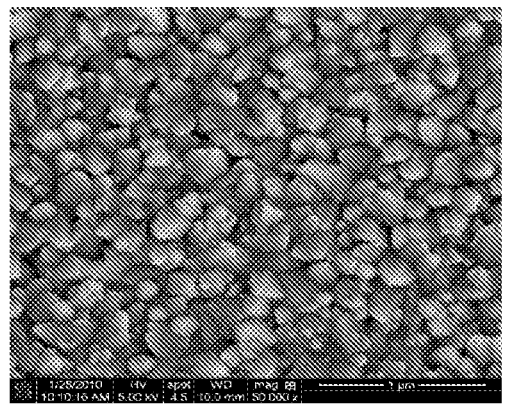
FIGS. 20A, 20B and 20C are SEM pictures showing a surface state of an In—Ga—As semiconductor layer depending on a forming temperature.
Figure 20B:
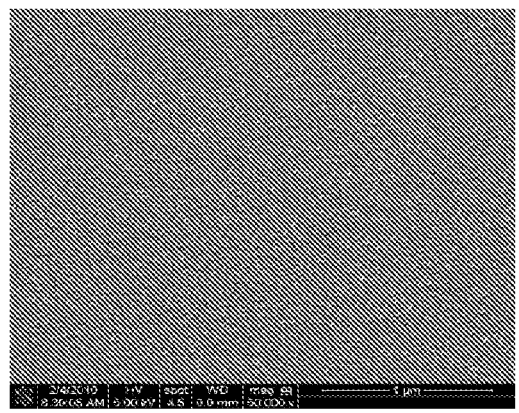
Figure 20C:
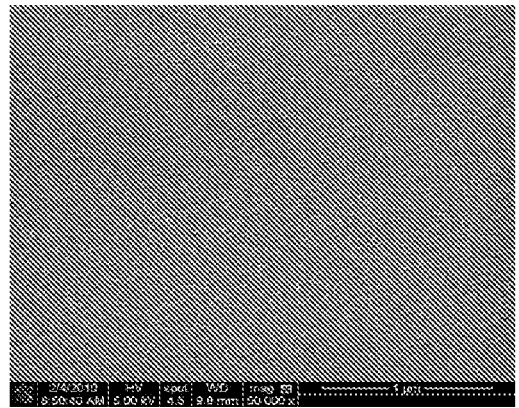

FIGS. 20A, 20B and 20C are SEM pictures showing a surface state of the semiconductor layer including In—Ga—As depending on a forming temperature.

FIG. 20A shows a surface state of the semiconductor layer formed at about 450° C., FIG. 20B shows a surface state of the semiconductor layer formed at about 300° C., and FIG. 20C shows a surface state of the semiconductor layer formed at about 200° C. Referring to FIGS. 20A, 20B and 20C, it can be seen that as the forming temperature is reduced, the grain size, amount of void and roughness of the surface states of the semiconductor layer are reduced.

Evaluation of a Characteristic of a Transistor Depending on a Forming Temperature Semiconductor layers formed at about 450° C., at about 300° C. and at about 250° C. were respectively patterned to form a semiconductor pattern on the silicon oxide layer, and a source electrode and a drain electrode including a Ti/Au layer were formed on the semiconductor pattern to form a transistor. A current Ids output from the source electrode was measured as a function of a voltage Vds applied to the drain electrode for four voltages about 0V, about 10V, about 20V and about 30V as Vg applied to the silicon wafer. Results obtained are shown in FIGS. 21A, 21B and 21C.

Figure 21A:
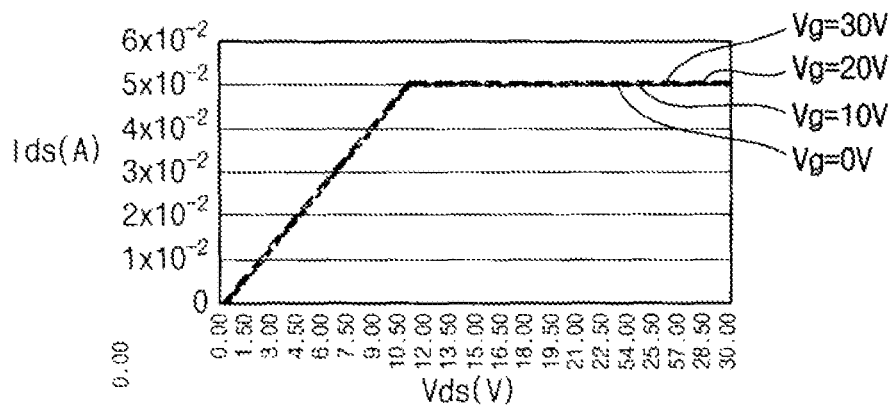
FIGS. 21A, 21B and 21C are graphs showing a voltage-current characteristic of an In—Ga—As semiconductor layer depending on a forming temperature.
Figure 21B:
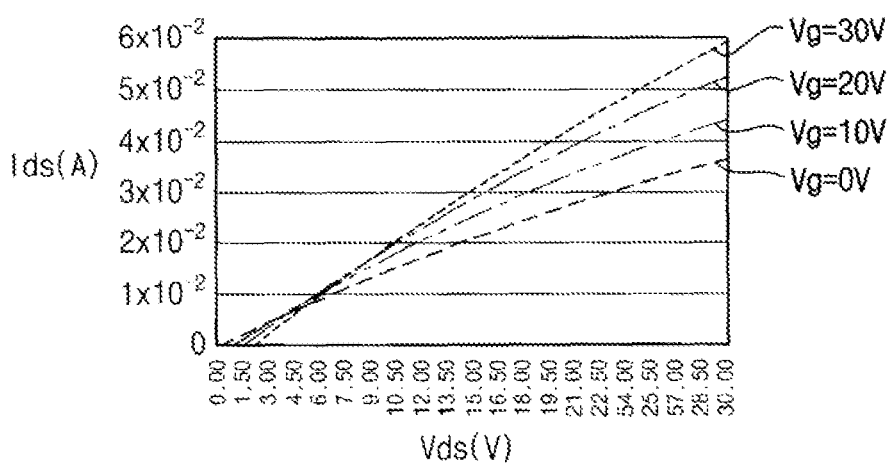
Figure 21C:
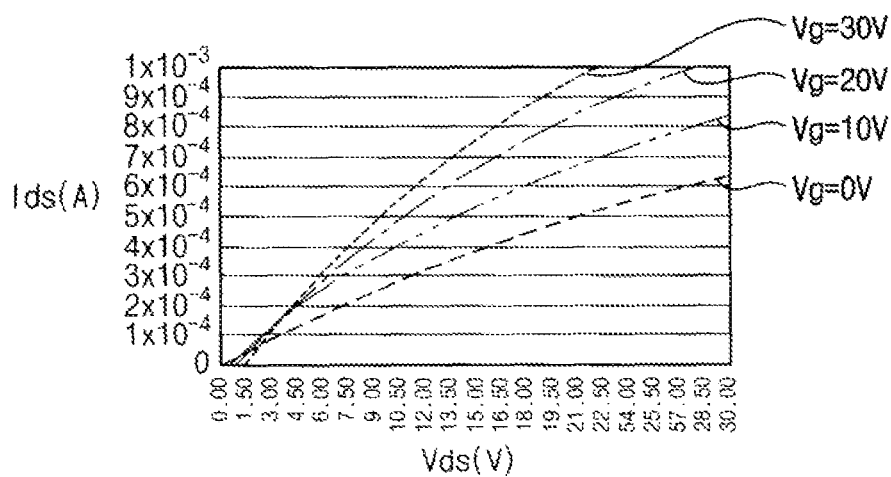

FIGS. 21A, 21B and 21C are graphs showing the voltage-current characteristics of an In—Ga—As semiconductor layer depending on a forming temperature for the In—Ga—As layer.

FIG. 21A is a graph showing the voltage-current relationship of a transistor including an In—Ga—As semiconductor layer formed at about 450° C. FIG. 21B is a graph showing the voltage-current relationship of a transistor including an In—Ga—As semiconductor layer formed at about 300° C. FIG. 21C is a graph showing a voltage-current relationship of a transistor including an In—Ga—As semiconductor layer formed at about 250° C. Referring to FIGS. 21A, 21B and 21C, it can be seen that the gradient of voltage-current lines as Vg is increased with respect to a voltage-current line of when Vg is about 0V increases as the forming temperature is reduced. Therefore, it can be seen that a modulation characteristic may be improved when the forming temperatures is about 250° C. versus when the forming temperatures is about 400° C.

Evaluation of a Characteristic of a Transistor Depending on a Thickness

A silicon oxide layer having a thickness of about 1000 Å was formed on an N+ type silicon wafer, and four different semiconductor layers that included In—Ga—As respectively having a thickness of about 150 Å, about 120 Å, about 90 Å and about 60 Å were formed through metal organic chemical vapor deposition (MOCVD) at about 250° C. Each of the semiconductor layers was patterned to form a semiconductor pattern on the silicon oxide layer, and a source electrode and a drain electrode that included a Ti/Au layer were formed on the semiconductor pattern to form a transistor. A current Ids output from the source electrode was measured as a function of four different voltages Vds applied to the drain electrode, of about 0V, about 10V, about 20V and about 30V as Vg were applied to the silicon wafer. The results obtained are shown in FIGS. 22A, 22B, 22C and 22D.

FIGS. 22A, 22B, 22C and 22D are graphs showing voltage-current characteristics of In—Ga—As semiconductor layers as a function of the thickness of the layer.

Figure 22A:
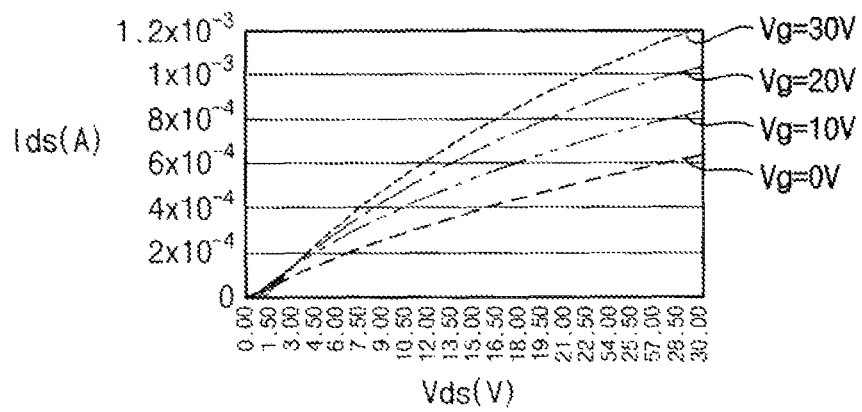
FIGS. 22A, 22B, 22C and 22D are graphs showing a voltage-current characteristic of an In—Ga—As semiconductor layer depending on a thickness.
Figure 22B:
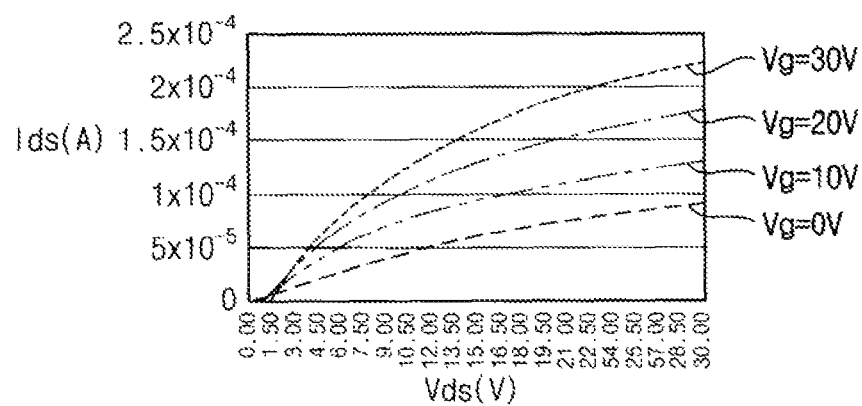
Figure 22C:
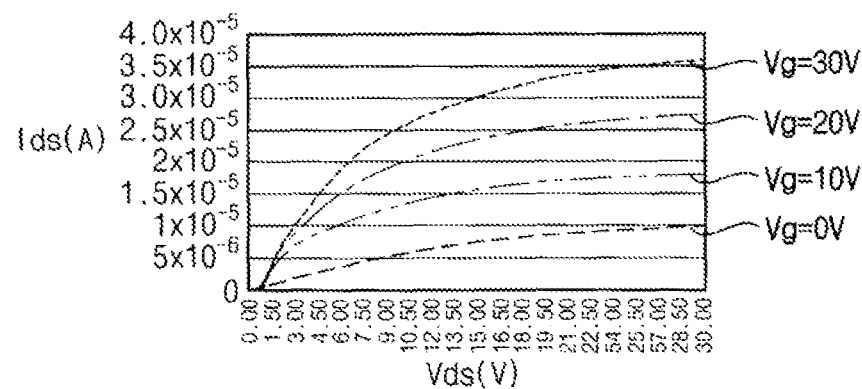
Figure 22D:
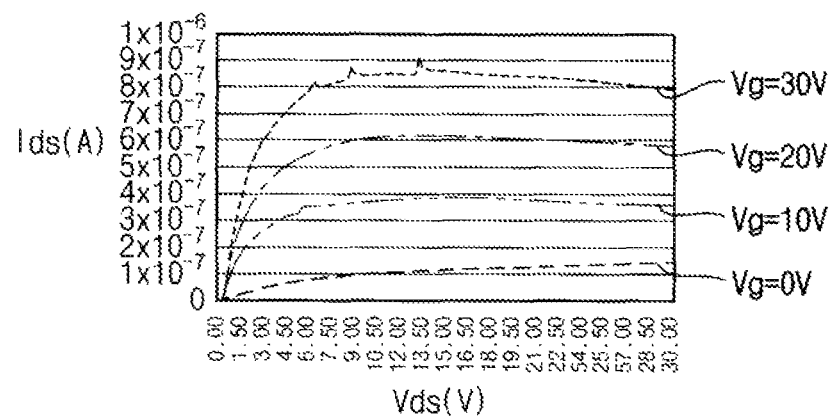

FIG. 22A is a graph showing the voltage-current relationship of a transistor in which the In—Ga—As semiconductor layer has a thickness of about 150 Å. FIG. 22B is a graph showing the voltage-current relationship of a transistor in which the In—Ga—As semiconductor layer has a thickness of about 120 Å. FIG. 22C is a graph showing the voltage-current relationship of a transistor in which the In—Ga—As semiconductor layer has a thickness of about 90 Å. FIG. 22D is a graph showing the voltage-current relationship of a transistor in which the In—Ga—As semiconductor layer has a thickness of about 60 Å. Referring to FIGS. 22A, 22B, 22C and 22D, it can be seen that a gradient of the voltage-current lines as Vg is increased with respect to a voltage-current line of when Vg is about 0V increases as the thickness of the semiconductor layer is reduced. Thus, a modulation characteristic may be more improved when the thickness of the semiconductor layer is about 60 Å versus when the thickness of the semiconductor layer is about 150 Å.

Analysis of a Crystal Phase of In—Ga—As

A thin layer including In—Ga—As was formed through metal organic chemical vapor deposition (MOCVD) at about 250° C., and the thin layer was analyzed by X ray. The results obtained are shown in FIG. 23.

Figure 23:
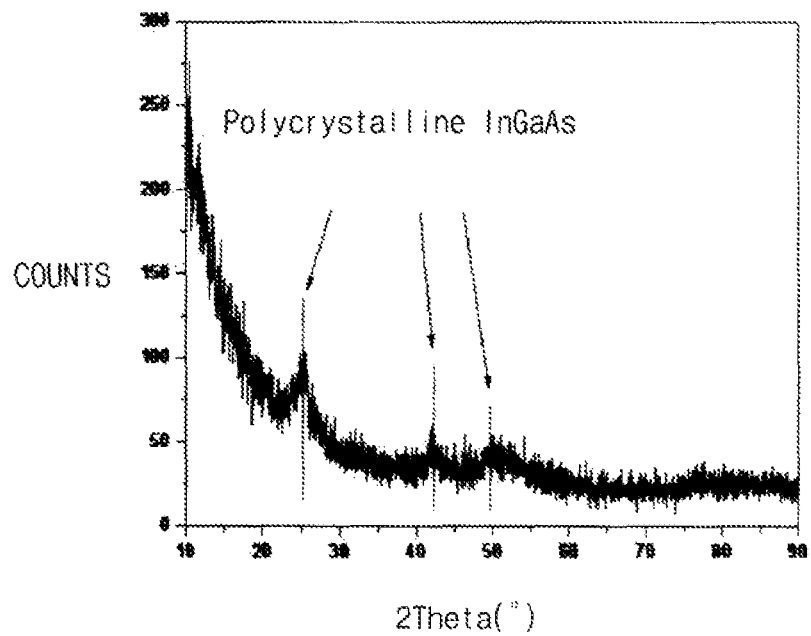
FIG. 23 is a graph showing analysis of a crystal phase of In—Ga—As using X ray.

FIG. 23 is a graph showing results of an analysis of a crystal phase of In—Ga—As using X ray.

Referring to FIG. 23, the 2 theta value of the thin layer including In—Ga—As has peaks at about 25°, about 42° and about 50°. Therefore, it can be noted that the crystal phase of the thin layer is a polycrystalline phase has a low degree of crystallinity.

Analysis of Composition of In—Ga—As

A thin layer including In—Ga—As was formed through metal organic chemical vapor deposition (MOCVD) at about 250° C., and the thin layer was analyzed by XPS. The results obtained are shown in FIGS. 24A and 24B.

Figure 24A:
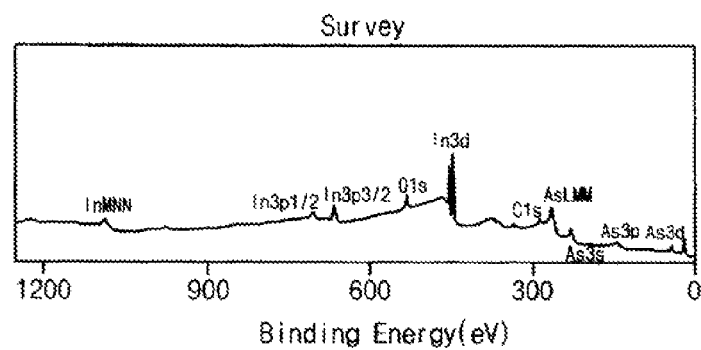
Figure 24B:
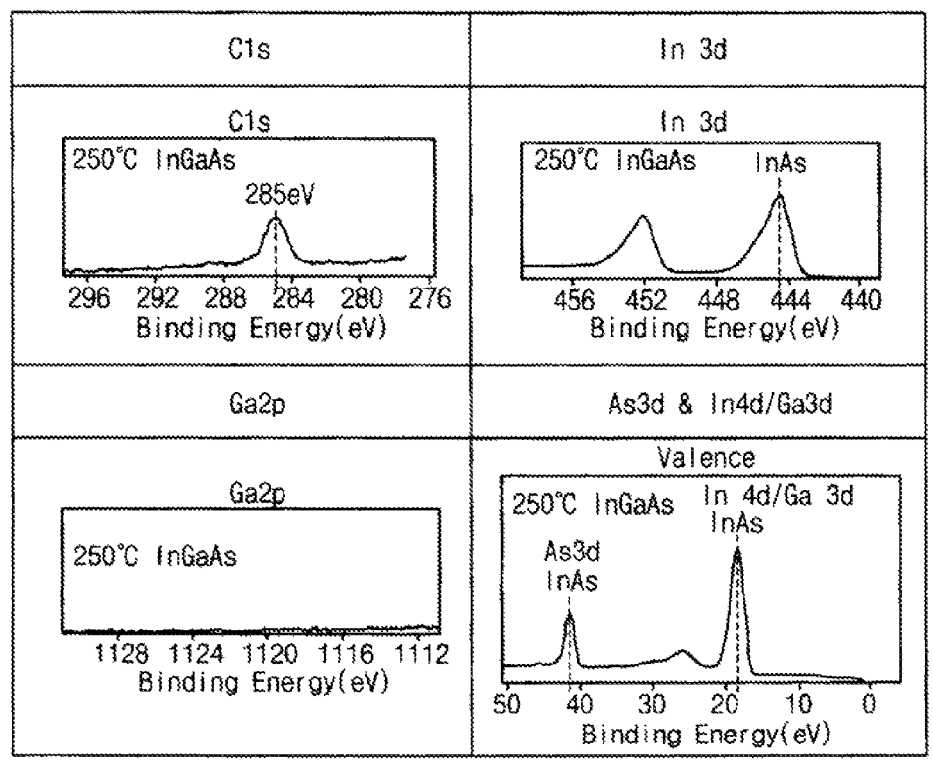
FIG. 24B is an enlarged graph showing peaks of FIG. 24A.

FIG. 24A is a graph showing XPS analysis of the thin layer including In—Ga—As, and FIG. 24B is an enlarged graph showing peaks of FIG. 24A.

Referring to FIGS. 24A and 24B, the XPS analysis graph for the thin layer including In—Ga—As has peaks at about 285 eV, about 444.5 eV, about 41.5 eV and about 18.3 eV. Therefore, the is orbital of carbon atoms, 3 d orbital of indium atoms, 3 d orbital of arsenic atoms and 4 d orbital of indium atoms can be identified. Furthermore, the 2 p orbital and 3 d orbital of gallium atoms can be identified. Thus, it can be seen that the thin layer has high content of indium with respect to gallium, so that a composition of the thin layer is close to In—As. Contents of indium and arsenic are respectively about 53 at % to about 47 at % (where at % refers to 100%* (atoms of corresponding element/total atoms). Thus, the atom ratio of indium to arsenic may be almost 1:1.

Evaluation of a Characteristic of a Heat-Treated Transistor

Three transistors having a semiconductor pattern that includes In—Ga—As were formed on an N+ type silicon wafer. One of the transistors was heated for an hour in a convection oven having a nitrogen atmosphere of about 350° C., and another one of the transistors was heated for two hours in the same convection oven under the same conditions. A current Ids output from the source electrode was measured as a function of a voltage Vds applied to the drain electrode, when about 0V, about 10V, about 20V and about 30V as Vg were applied to the silicon wafer. The results obtained are shown in FIGS. 25A, 25B and 25C.

Figure 25A:
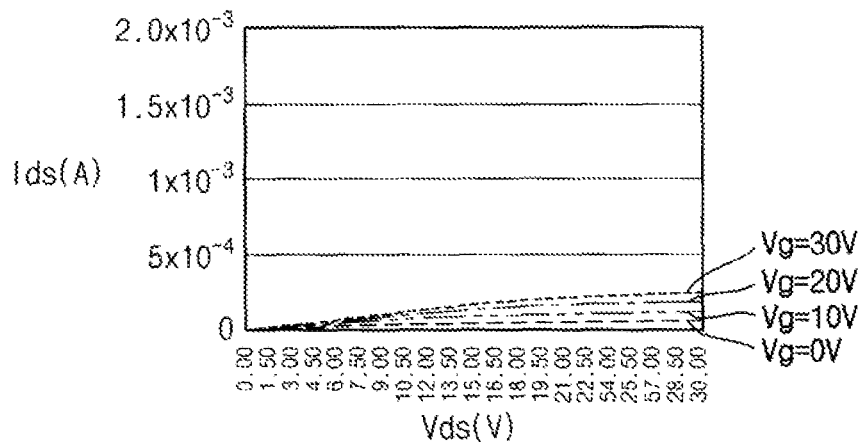
FIGS. 25A, 25B and 25C are graphs showing a voltage-current characteristic of an In—Ga—As semiconductor layer depending on a heating time.
Figure 25B:
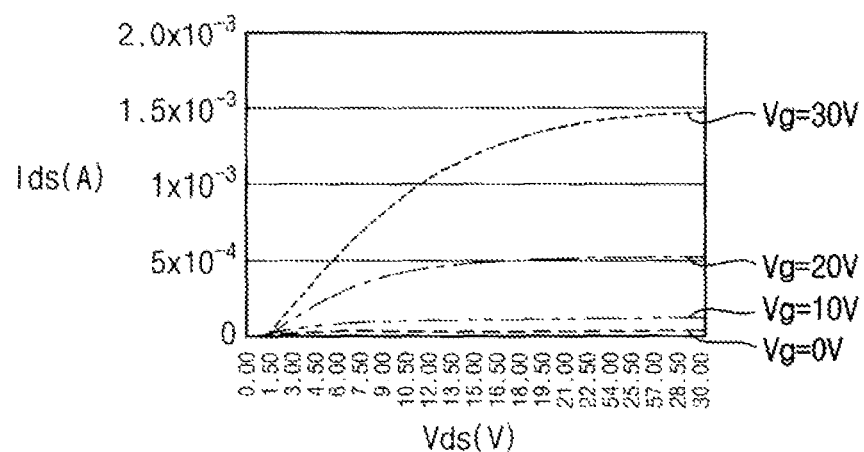
Figure 25C:
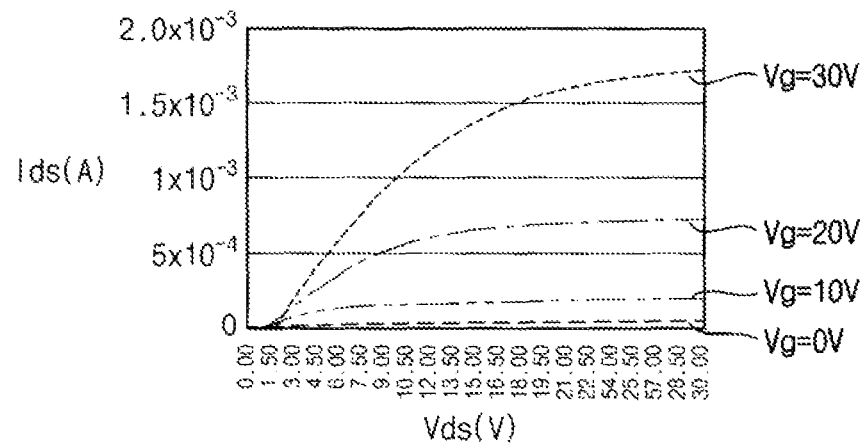

FIGS. 25A, 25B and 25C are graphs showing a voltage-current characteristic of an In—Ga—As semiconductor layer as a function of heating time.

FIG. 25A is a graph showing the voltage-current relationship of the transistor that was not heated. FIG. 25B is a graph showing the voltage-current relationship of the transistor that was heated for an hour. FIG. 25C is a graph showing the voltage-current relationship of the transistor that was heated for two hours. Referring to FIGS. 25A, 25B and 25C, it can be seen that the gradient of a voltage-current line as Vg is increased with respect to a voltage-current line of when Vg is about 0V increases as the heating time is increased. Therefore, a modulation characteristic may be improved when the transistor was heated for two hours as compared to when the transistor was not heated.

According to the above, a thin film transistor driven with a high speed may be formed on a thin film transistor substrate of a large-sized display device. Therefore, a driving characteristic of the thin film transistor may be improved, and a manufacturing cost of the display device may be reduced. The thin film transistor may be used, for example, for a display substrate of a liquid crystal display device or a display substrate of an electric luminescent display device.

What is claimed is:

1. A thin film transistor comprising:
a gate electrode formed on a substrate;
a semiconductor pattern overlapped with the gate electrode and including an amorphous multi-elements compound including at least one of Zn, Cd and Hg and at least one of S, Se, Te and Po, or including at least one of B, Al, Ga, In and Tl, and at least one of P, As, Sb and Bi, wherein the semiconductor pattern has an electron mobility no less than $1.0$ cm$^2$/Vs, and wherein the multi-elements compound has an amorphous phase;
a source electrode overlapped with a first end of the semiconductor pattern; and
a drain electrode overlapped with a second end of the semiconductor pattern and spaced apart from the source electrode.

2. The thin film transistor of claim 1, wherein the multi-elements compound includes one selected from the group consisting of GaAs, GaSb, GaBi, GaP, InP, InAs, InSb, InBi, CdS, CdSe, CdTe, ZnS, ZnSe, ZnTe, HgS, HgSe, HgTe, AlP, AlAs, AlSb and AlBi.

3. The thin film transistor of claim 1, wherein the multi-elements compound further includes at least one selected from the group consisting of a II A element, a III B element, a IV B element, a V B element, a VI B element, a VII B element, a I B element, a IV A element and VIII B element.

4. The thin film transistor of claim 3, wherein the multi-elements compound includes at least one selected from the group consisting of Be, Mg, Ca, Sr, Ba, Ra, Sc, Y, Ti, Zr, Hf, V, Nb, Ta, Cr, Mo, W, Mn, Tc, Re, C, Si, Ge, Sn, Pb, Cu, Ag, Au, Fe, Ru, Os, Co, Rh, Ir, Ni, Pd and Pt.

5. The thin film transistor of claim 1, wherein the multi-elements compound includes one selected from the group consisting of InGaP, InGaAs, InGaSb, InAlP, InAlAs, InAlSb, AlGaP, AlGaAs, AlGaSb, GaAsP, GaAsSb, GaAsBi, GaSbP, GaSbBi, GaSbP, GaBiP, AlAsP, AlAsSb, AlAsBi, AlSbP, AlSbBi, AlSbP, AlBiP, InAsP, InAsSb, InAsBi, InSbP, InSbBi, InSbP and InBiP.

6. The thin film transistor of claim 1, wherein the multi-elements compound further includes carbon, oxygen or hydrogen atoms, and wherein the content of each of the carbon, oxygen and hydrogen atoms is about $1 \times 10^{13}$ atoms/cm$^3$ to about $1 \times 10^{19}$ atoms/cm$^3$ of the multi-elements compound.

7. A thin film transistor comprising:
a gate electrode formed on a substrate;
a semiconductor pattern overlapped with the gate electrode and including a multi-elements compound, the multi-elements compound including at least one of Zn, Cd and Hg and at least one of S, Se, Te and Po, or including at least one of B, Al, Ga, In and Tl, and at least one of P, As, Sb and Bi wherein the multi-element compound has a mixed phase including an amorphous phase and a crystalline phase;
a source electrode overlapped with a first end of the semiconductor pattern; and
a drain electrode overlapped with a second end of the semiconductor pattern and spaced apart from the source electrode.

8. The thin film transistor of claim 7, wherein the crystalline phase includes a plurality of grains having a grain size of about $0.1$ nm to about $1$ μm.

9. The thin film transistor of claim 7, wherein the multi-elements compound includes one selected from the group consisting of GaAs, GaSb, GaBi, GaP, InP, InAs, InSb, InBi, CdS, CdSe, CdTe, ZnS, ZnSe, ZnTe, HgS, HgSe, HgTe, AlP, AlAs, AlSb and AlBi.

10. The thin film transistor of claim 7, wherein the amorphous multi-elements compound further includes at least one selected from the group consisting of a II A element, a III B element, a IV B element, a V B element, a VI B element, a VII B element, a I B element, a IV A element and VIII B element.

11. The thin film transistor of claim 10, wherein the multi-elements compound includes at least one selected from the group consisting of Be, Mg, Ca, Sr, Ba, Ra, Sc, Y, Ti, Zr, Hf, V, Nb, Ta, Cr, Mo, W, Mn, Tc, Re, C, Si, Ge, Sn, Pb, Cu, Ag, Au, Fe, Ru, Os, Co, Rh, Ir, Ni, Pd and Pt.

12. The thin film transistor of claim 7, wherein the multi-elements compound includes one selected from the group consisting of InGaP, InGaAs, InGaSb, InAlP, InAlAs, InAlSb, AlGaP, AlGaAs, AlGaSb, GaAsP, GaAsSb, GaAsBi, GaSbP, GaSbBi, GaSbP, GaBiP, AlAsP, AlAsSb, AlAsBi, AlSbP, AlSbBi, AlSbP, AlBiP, InAsP, InAsSb, InAsBi, InSbP, InSbBi, InSbP and InBiP.

13. The thin film transistor of claim 7, wherein an electron mobility of the semiconductor pattern is 1.0 cm$^2$/Vs to 3,500 cm$^2$/Vs.

14. A thin film transistor comprising:
a gate electrode formed on a substrate;
a semiconductor pattern overlapped with the gate electrode and including a multi-element compound selected from the group consisting of GaAs, GaSb, GaBi, GaP, InP, InAs, InSb, InBi, CdS, CdSe, CdTe, ZnS, ZnSe, ZnTe, HgS, HgSe, HgTe, AlP, AlAs, AlSb, AlBi, InGaP, InGaAs, InGaSb, InAlP, InAlAs, InAlSb, AlGaP, AlGaAs, AlGaSb, GaAsP, GaAsSb, GaAsBi, GaSbP, GaSbBi, GaSbP, GaBiP, AlAsP, AlAsSb, AlAsBi, AlSbP, AlSbBi, AlSbP, AlBiP, InAsP, InAsSb, InAsBi, InSbP, InSbBi, InSbP and InBiP, wherein the compound has a crystalline phase including a plurality of grains having a grain size of about 0.1 nm to about 1 μm;
a source electrode overlapped with a first end of the semiconductor pattern; and
a drain electrode overlapped with a second end of the semiconductor pattern and spaced apart from the source electrode.

15. The thin film transistor of claim 14, wherein the semiconductor pattern further includes at least one selected from the group consisting of a II A element, a III B element, a IV B element, a V B element, a VI B element, a VII B element, a I B element, a IV A element and VIII B element.

16. The thin film transistor of claim 15, wherein the semiconductor pattern includes at least one selected from the group consisting of Be, Mg, Ca, Sr, Ba, Ra, Sc, Y, Ti, Zr, Hf, V, Nb, Ta, Cr, Mo, W, Mn, Tc, Re, C, Si, Ge, Sn, Pb, Cu, Ag, Au, Fe, Ru, Os, Co, Rh, Ir, Ni, Pd and Pt.

* * * * *